(12) United States Patent
Wan et al.

(10) Patent No.: US 12,287,540 B2
(45) Date of Patent: Apr. 29, 2025

(54) ARRAY SUBSTRATE AND METHOD FOR MANUFACTURING SAME, AND LIQUID CRYSTAL PANEL

(71) Applicants: Hefei Xinsheng Optoelectronics Technology Co., Ltd., Anhui (CN); BOE Technology Group Co., Ltd., Beijing (CN)

(72) Inventors: Ting Wan, Beijing (CN); Ruifang Du, Beijing (CN); Chengyong Zhan, Beijing (CN); Na Sui, Beijing (CN); Yanlong Li, Beijing (CN)

(73) Assignees: HEFEI XINSHENG OPTOELECTRONICS TECHNOLOGY CO., LTD., Anhui (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/282,984

(22) PCT Filed: Aug. 31, 2022

(86) PCT No.: PCT/CN2022/116330
§ 371 (c)(1),
(2) Date: Sep. 19, 2023

(87) PCT Pub. No.: WO2024/045076
PCT Pub. Date: Mar. 7, 2024

(65) Prior Publication Data
US 2025/0035972 A1   Jan. 30, 2025

(51) Int. Cl.
G02F 1/1333 (2006.01)
G02F 1/1339 (2006.01)
(Continued)

(52) U.S. Cl.
CPC .... *G02F 1/133345* (2013.01); *G02F 1/13394* (2013.01); *G02F 1/136227* (2013.01);
(Continued)

(58) Field of Classification Search
None
See application file for complete search history.

(56) References Cited

U.S. PATENT DOCUMENTS 8,619,225 B2 * 12/2013 Fujita ............... G02F 1/134363
349/144
9,412,760 B1 * 8/2016 Bai ....................... H01L 29/45
(Continued)

FOREIGN PATENT DOCUMENTS

CN    101008750 A    8/2007
CN    101276103 A    10/2008
(Continued)

*Primary Examiner* — Ashok Patel
(74) *Attorney, Agent, or Firm* — IPro, PLLC

(57) ABSTRACT

Provided is an array substrate. The array substrate us provided with a display region and a non-display region on a periphery of the display region, and includes: a base substrate; a pixel electrode and a thin-film transistor on a side of the base substrate, wherein the pixel electrode and the thin-film transistor are disposed in the display region, and the pixel electrode is disposed on a side, facing away from the base substrate, of the thin-film transistor; a first passivation layer between the pixel electrode and the thin-film transistor, wherein a plurality of first vias are defined in the first passivation layer; and a second passivation layer on a side, facing away from the base substrate, of the pixel electrode, wherein a plurality of second vias are defined in the second passivation layer.

20 Claims, 10 Drawing Sheets

(51) Int. Cl.
 *G02F 1/1343* (2006.01)
 *G02F 1/1362* (2006.01)
 *G02F 1/1368* (2006.01)
 *H01L 27/12* (2006.01)

(52) U.S. Cl.
 CPC ........ *G02F 1/1368* (2013.01); *H01L 27/1248* (2013.01); *G02F 1/133305* (2013.01); *G02F 1/13439* (2013.01); *H01L 27/124* (2013.01)

(56) References Cited

U.S. PATENT DOCUMENTS

2007/0171319 A1* 7/2007 Fujita ................ G02F 1/134309
 349/123
2023/0134866 A1 5/2023 Ge et al.

FOREIGN PATENT DOCUMENTS

| | | |
|---|---|---|
| CN | 109870855 A | 6/2019 |
| CN | 112327546 A | 2/2021 |
| CN | 113064304 A | 7/2021 |
| CN | 113835565 A | 12/2021 |
| CN | 113867024 A | 12/2021 |
| CN | 215813670 U | 2/2022 |
| JP | 2009036947 A | 2/2009 |
| KR | 20050000684 A | 1/2005 |

\* cited by examiner

I-I' / I-I'

A4

ARRAY SUBSTRATE AND METHOD FOR MANUFACTURING SAME, AND LIQUID CRYSTAL PANEL

CROSS-REFERENCE TO RELATED APPLICATIONS

This application is a U.S. national stage of international application No. PCT/CN2022/116330, filed on Aug. 31, 2022, the disclosure of which is herein incorporated by reference in its entirety.

TECHNICAL FIELD

The present disclosure relates to the field of display technologies, and in particular, relates to an array substrate and a method for manufacturing the same, and a liquid crystal panel.

BACKGROUND OF THE INVENTION

With the improvement of the science and technology, more and more products or parts are provided with a liquid crystal panel. For example, a liquid crystal display panel is configured in a display device, and a liquid crystal handwriting panel in configured in a handwriting device.

SUMMARY OF THE INVENTION

Embodiments of the present disclosure provide an array substrate and a method for manufacturing the same, and a liquid crystal panel. The technical solutions are as follows.

In some embodiments of the present disclosure, an array substrate is provided. The array substrate is provided with a display region and a non-display region on a periphery of the display region. The array substrate includes:

a base substrate;

a pixel electrode and a thin-film transistor on a side of the base substrate, wherein the pixel electrode and the thin-film transistor are disposed in the display region, and the pixel electrode is disposed on a side, facing away from the base substrate, of the thin-film transistor;

a first passivation layer between the pixel electrode and the thin-film transistor, wherein a plurality of first vias are defined in the first passivation layer, at least part of the plurality of first vias are disposed in the display region, and the pixel electrode is electrically connected to the thin-film transistor through the at least part of the plurality of first vias in the display region; and a second passivation layer on a side, facing away from the base substrate, of the pixel electrode, wherein a plurality of second vias are defined in the second passivation layer, at least part of the plurality of second vias are disposed in the display region, the at least part of the plurality of second vias in the display region are in one-to-one correspondence to the at least part of the plurality of first vias in the display region, and an overlapped region is present between an orthogonal projection of each of the at least part of the plurality of second vias in the display region on the base substrate and an orthogonal projection of the corresponding first via on the base substrate.

In some embodiments, a central axis of each of the plurality of first vias is coincided with a central axis of the corresponding second via.

In some embodiments, a ratio of a size of an opening in a side, proximal to the base substrate, of each of the plurality of first vias to a size of an opening in a side, facing away from the base substrate, of each of the plurality of first vias is equal to a ratio of a size of an opening in a side, proximal to the base substrate, of the corresponding second via to a size of an opening in a side, facing away from the base substrate, of the corresponding second via.

In some embodiments, an orthogonal projection of each of the plurality of second vias on the base substrate is within an orthogonal projection of the corresponding first via on the base substrate.

In some embodiments, one part of the plurality of first vias are disposed in the display region, the other part of the plurality of first vias are disposed in the non-display region, one part of the plurality of second vias are disposed in the display region, and the other part of the plurality of second vias are disposed in the non-display region, wherein the other part of the plurality of second vias in the non-display region are in one-to-one correspondence to the other part of the plurality of first vias in the non-display region, and an overlapped region is present between an orthogonal projection of each of the other part of the plurality of second vias in the non-display region on the base substrate and an orthogonal projection of the corresponding first via on the base substrate.

In some embodiments, the array substrate further includes: a first electrode, a second electrode, and a first transparent connecting electrode that are disposed in the non-display region, wherein the first transparent connecting electrode and the pixel electrode are disposed in the same layer and made of the same material, the first transparent connecting electrode is in contact with the first electrode through one part of the plurality of first vias in the non-display region, and is in contact with the second electrode through the other part of the plurality of first vias in the non-display region.

In some embodiments, a width of each of the plurality of second vias in any direction parallel to the base substrate ranges from 5 microns to 12 microns.

In some embodiments, the array substrate further includes: a plurality of support pillars on a side, facing away from the base substrate, of the second passivation layer, and a plurality of auxiliary isolation pillars in the same layer and made of the same material as the plurality of support pillars, wherein the plurality of auxiliary isolation pillars are in one-to-one correspondence to the plurality of second vias and in one-to-one correspondence to the plurality of first vias, and at least part of each of the plurality of auxiliary isolation pillars is disposed in the corresponding first via and the corresponding second via.

In some embodiments, a height of each of the plurality of auxiliary isolation pillars is less than or equal to a sum of a depth of the corresponding first via and a depth of the corresponding second via.

In some embodiments, a first hollow cavity in the non-display region is further defined in the first passivation layer, and a second hollow cavity in the non-display region is further defined in the second passivation layer, wherein an overlapped region is present between an orthogonal projection of the second hollow cavity on the base substrate and an orthogonal projection of the first hollow cavity on the base substrate.

In some embodiments, the array substrate further includes: an auxiliary signal line in the display region, and a signal connecting electrode and a second transparent connecting electrode in the non-display region, wherein an overlapped region is present between an orthogonal projection of the auxiliary signal line on the base substrate and an orthogonal projection of the pixel electrode on the base substrate;

the signal connecting electrode and the auxiliary signal line are disposed in the same layer and made of the same material, the signal connecting electrode is electrically connected to the auxiliary signal line, and an overlapped region is present between an orthogonal projection of the signal connecting electrode on the base substrate and the orthogonal projection of the first hollow cavity on the base substrate; and the second transparent connecting electrode and the pixel electrode are disposed in the same layer and made of the same material, and the second transparent connecting electrode is in contact with the signal connecting electrode in the first hollow cavity.

In some embodiments, at least one first hollow cavity is defined in the first passivation layer, and an orthogonal projection of the second transparent connecting electrode on the base substrate is within the orthogonal projection of the first hollow cavity on the base substrate; and/or a plurality of first hollow cavities are defined in the first passivation layer, part of the orthogonal projection of the second transparent connecting electrode on the base substrate is within the orthogonal projection of the first hollow cavity on the base substrate, and the other part of the second transparent connecting electrode is beyond the orthogonal projection of the first hollow cavity on the base substrate.

In some embodiments, a side, facing away from the base substrate, of the second transparent connecting electrode is in contact with a common electrode layer in a cover plate through a conductive connecting structure, wherein at least part of the conductive connecting structure is within at least one of the second hollow cavity.

In some embodiments, a first connecting cavity in the non-display region is further defined in the first passivation layer, and a second connecting cavity in the non-display region is further defined in the second passivation layer, wherein an overlapped region is present between an orthogonal projection of the second connecting cavity on the base substrate and an orthogonal projection of the first connecting cavity on the base substrate.

In some embodiments, the array substrate further includes: a plurality of signal lines in the display region, and a plurality of pads and a plurality of third transparent connecting electrodes in the non-display region, wherein the plurality of signal lines are electrically connected to the plurality of pads in one-to-one correspondence, and an overlapped region is present between an orthogonal projection of each of the plurality of pads on the base substrate and the orthogonal projection of the first connecting cavity on the base substrate; and the plurality of third transparent connecting electrodes and the pixel electrode are disposed in the same layer and made of the same material, the plurality of third transparent connecting electrodes are in one-to-one correspondence to the plurality of pads, and each of the plurality of third transparent connecting electrodes is in contact with the corresponding pad in the first connecting cavity.

In some embodiments, one of the first connecting cavity is defined in the first passivation layer, orthogonal projection of the plurality of pads on the base substrate are within the orthogonal projection of the first connecting cavity on the base substrate; or a plurality of first connecting cavities are defined in the first passivation layer, the plurality of first connecting cavities are in strip shape and are in one-to-one correspondence to the plurality of pads, and an orthogonal projection of each of the plurality of pads on the base substrate is at least partially within an orthogonal projection of the corresponding first connecting cavity on the base substrate.

In some embodiments of the present disclosure, a method for manufacturing an array substrate is provided. The method includes:

sequentially forming a thin-film transistor, a first passivation layer, a pixel electrode, and a second passivation layer on a side of the base substrate, wherein the array substrate is provided with a display region and a non-display region on a periphery of the display region, the pixel electrode and the thin-film transistor are disposed in the display region, and the pixel electrode is disposed on a side, facing away from the base substrate, of the thin-film transistor;

the first passivation layer is disposed between the pixel electrode and the thin-film transistor, a plurality of first vias are defined in the first passivation layer, at least part of the plurality of first vias are disposed in the display region, and the pixel electrode is electrically connected to the thin-film transistor through the at least part of the plurality of first vias in the display region; and the second passivation layer is disposed on a side, facing away from the base substrate, of the pixel electrode, a plurality of second vias are defined in the second passivation layer, at least part of the plurality of second vias are disposed in the display region, the at least part of the plurality of second vias in the display region are in one-to-one correspondence to the at least part of the plurality of first vias in the display region, and an overlapped region is present between an orthogonal projection of each of the at least part of the plurality of second vias in the display region on the base substrate and an orthogonal projection of the corresponding first via on the base substrate.

In some embodiments, the first passivation layer is acquired by patterning an insulative thin film on the side, facing away from the base substrate, of the thin-film transistor using a target mask plate, and the second passivation layer is acquired by patterning an insulative thin film on the side, facing away from the base substrate, of the pixel electrode using the target mask plate.

In some embodiments of the present disclosure, a liquid crystal panel is provided. The liquid crystal panel includes: an array substrate and a cover plate that are opposite, and a liquid crystal layer between the array substrate and the cover plate, wherein the array substrate is the above array substrate.

In some embodiments, the liquid crystal panel is a liquid crystal handwriting board, the liquid crystal layer includes bistable liquid crystal molecules, and the cover plate includes a flexible base substrate and a common electrode layer on a side of the flexible base substrate.

BRIEF DESCRIPTION OF DRAWINGS

For clearer description of the technical solutions in the embodiments of the present disclosure, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DETAILED DESCRIPTION OF THE INVENTION

For clearer descriptions of the objectives, technical solutions, and advantages of the present disclosure, the embodiments of the present disclosure are described in detail hereinafter with reference to the accompanying drawings.

The liquid crystal panel generally includes: an array substrate, a cover plate, and a liquid crystal layer between the array substrate and the cover plate. The array substrate includes a first base substrate, and a pixel electrode on a side of the first base substrate. The cover plate includes a second base substrate and a common electrode layer on a side of the second base substrate.

However, in manufacturing the liquid crystal panel, foreign matter is easily introduced to a position between the array substrate and the cover plate (for example, dirt, dust, and the like), and the foreign matter may conduct the pixel electrode in the array substrate and the common electrode layer in the cover plate, such that a poor phenomenon of abnormal display or failure of erasing handwriting exists in a corresponding position of the liquid crystal panel, and thus a problem of poor display of the liquid crystal panel is caused.

Figure 1:
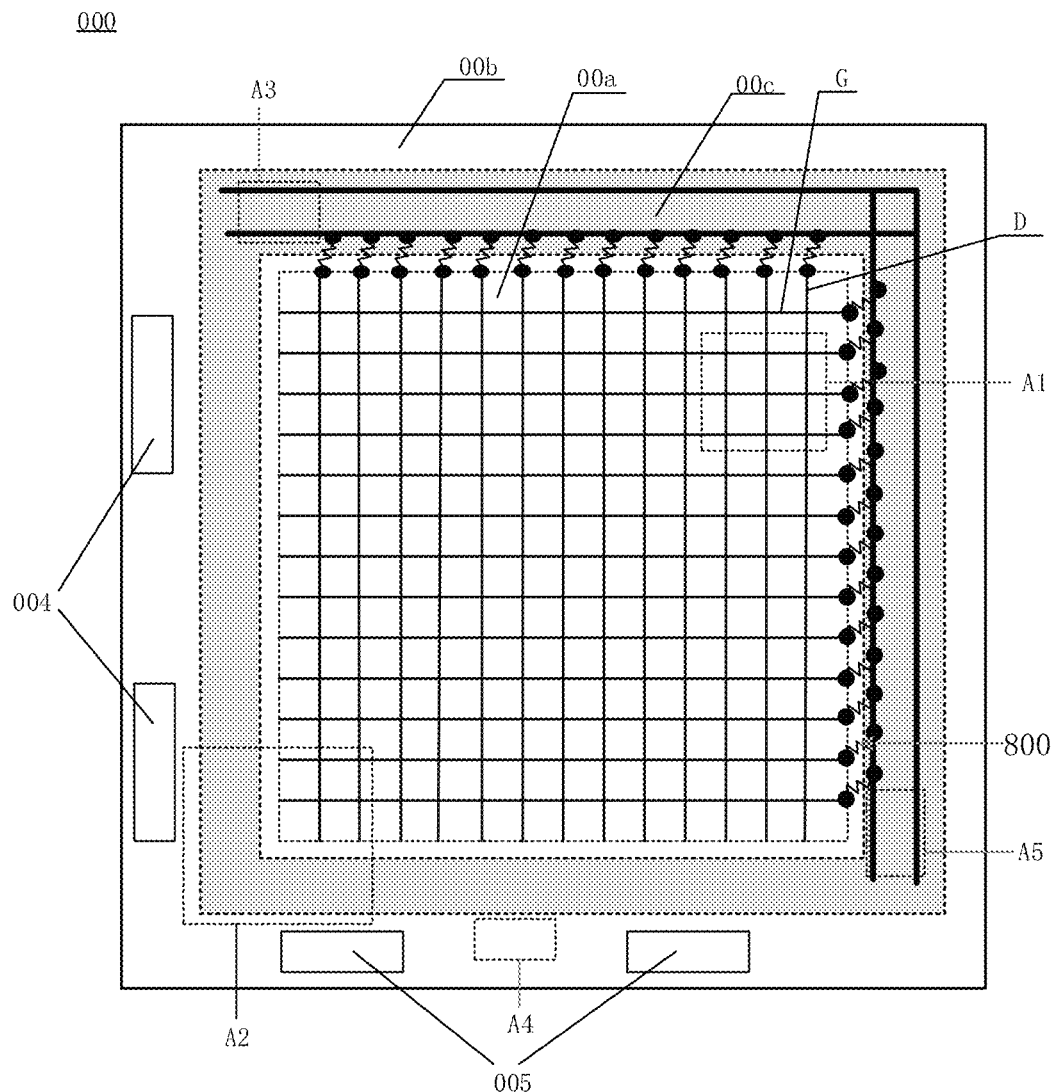
FIG. 1 is a top view of an array substrate according to some embodiments of the present disclosure.

Referring to FIG. 1, FIG. 1 is a top view of an array substrate according to some embodiments of the present disclosure. The array substrate 000 is provided with a display region 00a and a non-display region 00b on a periphery pf the display region 00a.

Figure 2:
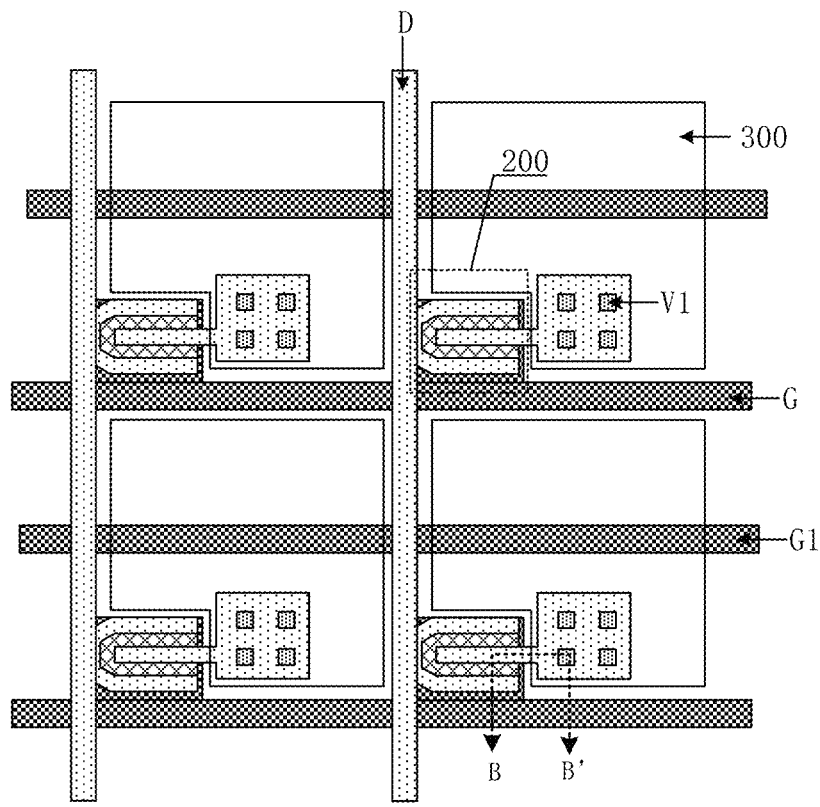
FIG. 2 is a locally enlarged diagram of the array substrate shown in FIG. 1 at A1.
Figure 3:
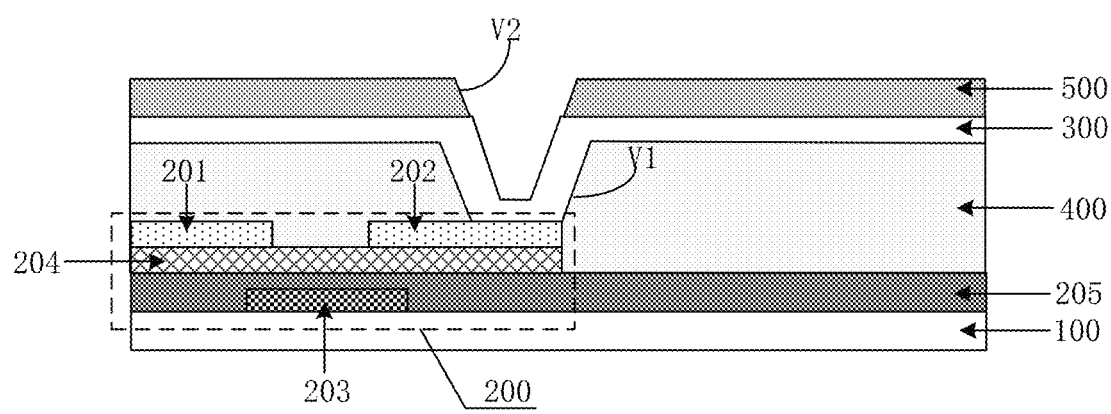
FIG. 3 is a schematic diagram of film layers of the array substrate shown in FIG. 2 at B-B'.

For a clear structure of the array substrate, referring to FIG. 2 and FIG. 3, FIG. 2 is a locally enlarged diagram of the array substrate shown in FIG. 1 at A1, and FIG. 3 is a schematic diagram of film layers of the array substrate shown in FIG. 2 at B-B'. The array substrate 000 includes a base substrate 100, and a pixel electrode 300, a thin-film transistor 200, a first passivation layer 400, and a second passivation layer 500 on a side of the base substrate 100.

The pixel electrode 300 and the thin-film transistor 200 in the array substrate 000 are disposed in the display region 00a, and the pixel electrode 300 is disposed on a side, facing away from the base substrate 100, of the thin-film transistor 200. The pixel electrode 300 is electrically connected to the thin-film transistor 200.

The first passivation layer 400 in the array substrate 000 is disposed between the pixel electrode 300 and the thin-film transistor 200. A plurality of first vias V1 are defined in the first passivation layer 400, and at least part of the plurality of first vias V1 are disposed in the display region 00a. In this case, the pixel electrode 300 is electrically connected to the thin-film transistor 200 through the at least part of the plurality of first vias V1 in the display region 00a.

The second passivation layer 500 in the array substrate 000 is disposed on a side, facing away from the base substrate 100, of the pixel electrode 300. A plurality of second vias V2 are defined in the second passivation layer 500, and at least part of the plurality of second vias V2 are disposed in the display region 00a, the at least part of the plurality of second vias V2 in the display region 00a are in one-to-one correspondence to the at least part of the plurality of first vias V1 in the display region 00a, and an overlapped region is present between an orthogonal projection of each of the at least part of the plurality of second vias V2 in the display region 00a on the base substrate 100 and an orthogonal projection of the corresponding first via V1 on the base substrate 100.

In the embodiments of the present disclosure, as the second passivation layer 500 is disposed on the side, facing away from the base substrate 100, of the pixel electrode 300, in forming the liquid crystal panel by attaching the array substrate 000 and the cover plate, even if the foreign matter is introduced to a position between the array substrate 000 and the cover plate, the foreign matter does not conduct the pixel electrode 300 in the array substrate 000 and the common electrode layer in the cover plate based on the insulation of the second passivation layer 500 on the side, facing away from the base substrate 100, of the pixel electrode 300, such that the poor phenomenon of abnormal display or failure of erasing handwriting exists in the sequentially acquired liquid crystal panel is avoided, and the display effect of the liquid crystal panel is great.

In addition, as the portion, in the display region 00a, of the plurality of first vias V1 in the first passivation layer 400 is in one-to-one correspondence to the portion, in the display region 00a, of the plurality of second vias V2 in the second passivation layer 500, and the overlapped region is present between the orthogonal projection of the second via V2 on the base substrate 100 and the orthogonal projection of the corresponding first via V1 on the base substrate 100, the mask plate used in forming the plurality of first vias V1 in the first passivation layer 400 is the same as the mask plate used in forming the plurality of second vias V2 in the second passivation layer 500. That is, the plurality of first vias V1 in the first passivation layer 400 and the plurality of second vias V2 in the second passivation layer 500 are formed using the same mask plate. As such, in manufacturing the array substrate 000, it is not necessary to specially develop and produce the mask plate corresponding to the second passivation layer 500, and thus the manufacturing cost of the array substrate 000 is efficiently reduced.

In summary, the array substrate in the embodiments of the present disclosure incudes a base substrate, and a pixel electrode, a thin-film transistor, a first passivation layer, and a second passivation layer that are disposed on a side of the base substrate. As the second passivation layer is disposed on the side, facing away from the base substrate, of the pixel electrode, in forming the liquid crystal panel by attaching the array substrate and the cover plate, even if foreign matter is introduced to a position between the array substrate and the cover plate, the foreign matter does not conduct the pixel electrode in the array substrate and the common electrode layer in the cover plate based on insulation of the second passivation layer on the side, facing away from the base substrate, of the pixel electrode, such that a poor phenomenon of abnormal display or failure of erasing handwriting exists in the sequentially acquired liquid crystal panel is avoided, and the display effect of the liquid crystal panel is great. In addition, as a portion, in the display region, of the plurality of first vias in the first passivation layer is in one-to-one correspondence to a portion, in the display region, of the plurality of second vias in the second passivation layer, and an overlapped region is present between an orthogonal projection of the second via on the base substrate and an orthogonal projection of the corresponding first via on the base substrate, the mask plate used in forming the plurality of first vias in the first passivation layer is the same as the mask plate used in forming the plurality of second vias in the second passivation layer. As such, in manufacturing the array substrate, it is not necessary to specially develop and produce the mask plate corresponding to the second passivation layer, and thus the manufacturing cost of the array substrate is efficiently reduced.

In the embodiments of the present disclosure, one part of the plurality of first vias V1 in the first passivation layer 400 are disposed in the display region 00a, and the other part of the plurality of first vias V1 in the first passivation layer 400 are disposed in the non-display region 00b.

In some embodiments, the plurality of second vias V2 in the second passivation layer 500 are all disposed in the display region 00a. In this case, the plurality of first vias V1 in the first passivation layer 400 and the plurality of second vias V2 in the second passivation layer 500 are formed using the same mask plate, and a blocking plate is required to block a portion of the mask plate corresponding to the non-display region 00b in forming the plurality of second vias V2 in the second passivation layer 500 using the mask plate, such that the plurality of second vias V2 sequentially formed in the second passivation layer 500 are all disposed in the display region 00a.

Illustratively, upon forming the first passivation layer 400 on the side, facing away from the base substrate 100, of the thin-film transistor 200, a one patterning process is performed on the first passivation layer 400 using a target mask plate, such that the plurality of first vias V1 are formed in the first passivation layer 400. Upon forming the second passivation layer 500 on the side, facing away from the base substrate 100, of the pixel electrode 300, the blocking plate is used to block the portion of the target mask plate corresponding to the non-display region 00b, and a one patterning process is performed on the second passivation layer 500, such that the plurality of second vias V2 are formed in the second passivation layer 500.

In some embodiments, one part of the plurality of second vias V2 in the second passivation layer 500 are disposed in the display region 00a, and the other part of the plurality of second vias V2 in the second passivation layer 500 are disposed in the non-display region 00b. The second vias V2 in the non-display region 00b are in one-to-one correspondence to the first vias V1 in the non-display region 00b, and an overlapped region is present between an orthogonal projection of the second via V2 in the non-display region 00b on the base substrate 100 and an orthogonal projection of the corresponding first via V1 on the base substrate 100.

In this case, the plurality of first vias V1 in the first passivation layer 400 are in one-to-one correspondence to the plurality of second vias V2 in the second passivation layer 500, and an overlapped region is present between an orthogonal projection of each second via V2 on the base substrate 100 and an orthogonal projection of the corresponding first via V1 on the base substrate 100. The plurality of first vias V1 in the first passivation layer 400 and the plurality of second vias V2 in the second passivation layer 500 are respectively formed using the same mask plate. In addition, in forming the plurality of second vias V2 in the second passivation layer 500 using the same mask plate, it is not necessary to block the portion of the mask plate corresponding to the non-display region 00b using the blocking plate, such that the manufacturing cost of the array substrate 000 is further reduced.

Illustratively, upon forming the first passivation layer 400 on the side, facing away from the base substrate 100, of the thin-film transistor 200, a one patterning process is performed on the first passivation layer 400 using the target mask plate, such that the plurality of first vias V1 are formed in the first passivation layer 400. Upon forming the second passivation layer 500 on the side, facing away from the base substrate 100, of the pixel electrode 300, a one patterning process is performed on the second passivation layer 500 using the target mask plate again, such that the plurality of second vias V2 are formed in the second passivation layer 500.

It should be noted that the one patterning process in the embodiments of the present disclosure indicates photoresist coating, exposing, developing, etching, and photoresist removing. It should be further noted that the following embodiments are illustrated by taking the plurality of second vias V2 in the second passivation layer 500 being in the display region 00a and the non-display region 00b as an example.

In the embodiments of the present disclosure, as the plurality of first vias V1 in the first passivation layer 400 and the plurality of second vias V2 in the second passivation layer 500 are formed using the same mask plate, a central axis of each of the plurality of first vias V1 is coincided with a central axis of the corresponding second via V2. However, in practical application, the central axis of each of the plurality of first vias V1 may be not coincided with the central axis of the corresponding second via V2 due to the manufacturing error, a distance is present between the central axis of each of the plurality of first vias V1 and the central axis of the corresponding second via V2, and the distance is generally less. For example, the distance between the central axis of each of the plurality of first vias V1 and the central axis of the corresponding second via V2 is less than or equal to 0.1 microns.

In the present disclosure, as the first via V1 is formed by etching the first passivation layer 400, and the second via V2 is formed by etching the second passivation layer 500, a size of an opening in a side, proximal to the base substrate 100, of the first via V1 is generally less than a size of an opening in a side, facing away from the base substrate 100, of the first via V1, and a size of an opening in a side, proximal to the base substrate 100, of the second via V2 is generally less than a size of an opening in a side, facing away from the base substrate 100, of the second via V2. In addition, in the case that the first passivation layer 400 and the second passivation layer 500 are made of the same material, and the plurality of first vias V1 in the first passivation layer 400 and the plurality of second vias V2 in the second passivation layer 500 are formed using the same mask plate, a rate of etching the first passivation layer 400 is equal to a rate of etching the second passivation layer 500, such that a ratio of the size of the opening in the side, proximal to the base substrate 100, of the first via V1 to the size of the opening in the side, facing away from the base substrate 100, of the first via V1 is equal to a ratio of the size of the opening in the side, proximal to the base substrate 100, of the corresponding second via V2 to the size of the opening in the side, facing away from the base substrate 100, of the corresponding second via V2.

In addition, the size of the via in the passivation layer is correlated with a thickness of the passivation layer. For example, the greater the thickness of the passivation layer, and the longer the time of etching the passivation layer, the greater the size of the via formed in the passivation layer. The less the thickness of the passivation layer, and the shorter the time of etching the passivation layer, the less the size of the via formed in the passivation layer. In the present disclosure, a thickness of the first passivation layer 400 ranges from 300 nm to 1000 nm, and a thickness of the second passivation layer 500 ranges from 150 nm to 400 nm. Thus, in some embodiments, the thickness of the first passivation layer 400 is greater than the thickness of the second passivation layer 500, and the size of the first via V1 in the first passivation layer 400 is greater than the size of the second via V2 in the second passivation layer 500. In this case, the orthogonal projection of the second via V2 on the base substrate 100 is within the orthogonal projection of the corresponding first via V1 on the base substrate 100.

The following embodiments are illustrated in the following two aspects for the function of the first via V1 in the display region 00a and the function of the first via V1 in the non-display region 00b.

In a first aspect, for the first via V1 in the display region 00a, as shown in FIG. 2 and FIG. 3, the pixel electrode 300 in the array substrate 000 is electrically connected to the thin-film transistor 200 through the first via V1.

Illustratively, a plurality of the pixel electrodes 300 and a plurality of thin-film transistors 200 are disposed in the array substrate 000, and each pixel electrode 300 is electrically connected to the corresponding thin-film transistor 200 through at least one first via V1.

The thin-film transistor 200 includes a source 201, a drain 202, a gate 203, and an active layer 204. The source 201 and the drain 202 are in contact with the active layer 204, and the gate 203 is insulated from the active layer 204. For example, a gate insulative layer 205 is disposed between the gate 203 and the active layer 204. Both the source 201 and the drain 202 are disposed on a side, facing away from the base substrate 100, of the active layer 204, and the gate 203 is disposed on a side, proximal to the base substrate 100, of the active layer 204. That is, the thin-film transistor 200 is a bottom-gate thin-film transistor. In some embodiments, the thin-film transistor 200 is a top-gate thin-film transistor, which is not limited in the embodiments of the present disclosure.

In the present disclosure, each pixel electrode 300 is electrically connected to one of the source 201 and the drain 202 of the corresponding thin-film transistor 200 through at least one first via V1. The array substrate 000 further includes a plurality of gate lines G and a plurality of data lines D in the display region 00a. The plurality of gate lines G are arranged in parallel, the plurality of data lines D are arranged in parallel, and an extension direction of the data line D is perpendicular to an extension direction of the gate line G. As such, any two adjacent data lines D and any two adjacent gate lines G enclose a pixel sub-region, and each pixel sub-region includes one pixel electrode 300 and the thin-film transistor 200 corresponding to the pixel electrode 300. Thus, the thin-film transistors 200 in the display region 00a are arranged in a plurality of rows and a plurality of columns. One data line D is electrically connected to the other of the source 201 and the drain 202 of one column of thin-film transistors 200, and one gate line G is electrically connected to the gate 203 of one row of thin-film transistors 200. The source 201 and the drain 202 of the thin-film transistors 200 and the data line D are disposed in the same layer and made of the same material, and the gate 203 of the thin-film transistors 200 and the gate line G are disposed in the same layer and made of the same material. It should be noted that a metal conductive layer of the gate 203 is referred to as the gate metal layer, and a metal conductive layer of the source 201 and the drain 202 is referred to as the source and drain metal layer in the following embodiments.

In the embodiments of the present disclosure, the second passivation layer 500 in the array substrate 000 is disposed on the side, facing away from the base substrate 100, of the pixel electrode 300. The plurality of second vias V2 in the second passivation layer 500 in the display region 00a are in one-to-one correspondence to the plurality of first vias V1 in the first passivation layer 400 in the display region, and the orthogonal projection of each second via V2 on the base substrate 100 is within the orthogonal projection of the corresponding first via V1 on the base substrate 100. As part of the pixel electrode 300 requires to be disposed in the first via V1, the orthogonal projection of each second via V2 on the base substrate 100 is within an orthogonal projection of the corresponding pixel electrode 300 on the base substrate 100.

In this case, in attaching the array substrate 000 and the cover plate, the foreign matter between the array substrate 000 and the cover plate may pass through the second via V2 in the second passivation layer 500 in the display region 00a to be in contact with the pixel electrode 300. Thus, in attaching the array substrate 000 and the cover plate, the following two types of embodiments are shown to reduce a possibility of conducting the pixel electrode 300 and the common electrode layer by the foreign matter between the array substrate 000 and the cover plate.

In a first type of embodiments, the size of the second via V2 in the second passivation layer 500 is reduced. For example, a width of the second via V2 in any direction parallel to the base substrate 100 ranges from 5 microns to 12 microns. It should be noted that the width of the second via V2 indicates a width of an opening, facing away from the base substrate 100, of the second via V2. As such, in the case that the width of the opening, facing away from the base substrate 100, of the second via V2 in any direction parallel to the base substrate 100 is less, even if the foreign matter is introduced to a position between the array substrate 000 and the cover plate in attaching the array substrate 000 and the cover plate, the foreign matter does not enter the second via V2 from the opening, facing away from the base substrate 100, of the second via V2, such that the foreign matter is not in contact with the pixel electrode 300 on a side, proximal to the base substrate 100, of the second passivation layer 500, and the pixel electrode 300 and the common electrode layer are not conducted by the foreign matter.

Figure 4:
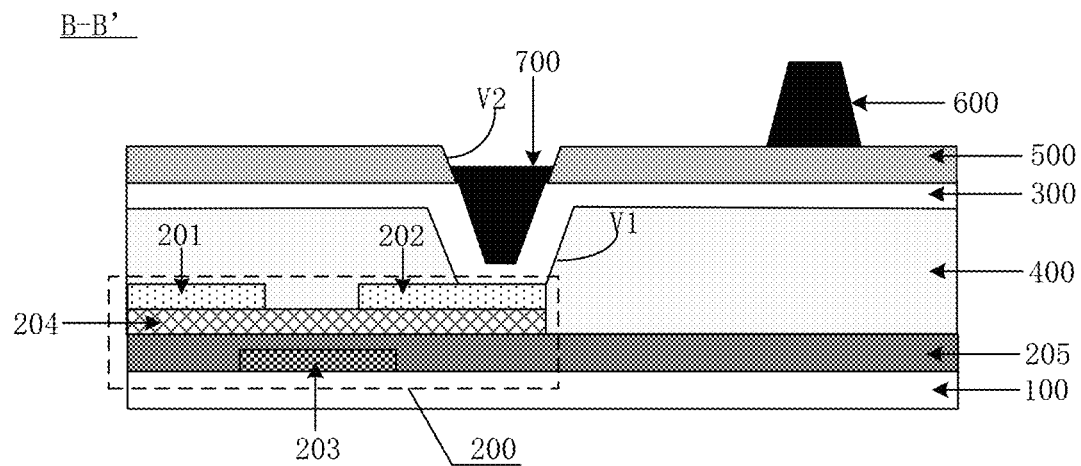
FIG. 4 is a schematic diagram of another film layers of the array substrate shown in FIG. 2 at B-B'.

In a second type of embodiments, referring to FIG. 4, FIG. 4 is a schematic diagram of another film layers of the array substrate shown in FIG. 2 at B-B'. The array substrate 000 further includes a plurality of support pillars 600 on a side, facing away from the base substrate 100, of the second passivation layer, and a plurality of auxiliary isolation pillars 700 in the same layer and made of the same material as the plurality of support pillars. The plurality of auxiliary isolation pillars 700 are in one-to-one correspondence to the plurality of second vias V2 in the second passivation layer 500 and in one-to-one correspondence to the plurality of first vias V1 in the first passivation layer 400, and at least part of each of the plurality of auxiliary isolation pillars is disposed in the corresponding first via V1 and the corresponding second via V2. As such, the auxiliary isolation pillar 700 protects a portion, exposed from the second via V2, of the pixel electrode 300. Thus, even if the foreign matter is introduced to the position between the array substrate 000 and the cover plate in attaching the array substrate 000 and the cover plate, the foreign matter is blocked by the auxiliary isolation pillar 700, such that the foreign matter is not in contact with the pixel electrode 300 on the side, proximal to the base substrate 100, of the second passivation layer 500, and the pixel electrode 300 and the common electrode layer are not conducted by the foreign matter.

It should be noted that the structures being disposed in the same layer and made of the same material indicates that the two structures are formed by the one patterning process. Illustratively, the support pillar 600 and the auxiliary isolation pillar 700 being disposed in the same layer and made of the same material indicates that the support pillar 600 and the auxiliary isolation pillar 700 are formed by the one patterning process. For example, in manufacturing the array substrate 000, the support pillar 600 and the auxiliary isolation pillar 700 are formed by the one patterning process upon forming of the second passivation layer 500 and forming of the plurality of second vias V2 in the second passivation layer 500.

The liquid crystal panel formed by attaching the array substrate 000 and the cover plate is supported by the support pillar 600, such that a problem of damage of the liquid crystal panel in pressing the cover plate in the liquid crystal panel by the user is avoided. In the present disclosure, in the case that the support pillar 600 and the auxiliary isolation pillar 700 are formed by the one patterning process, the auxiliary isolation pillar 700 capable of blocking the foreign matter is disposed in the second via V2 on the premise that the manufacturing cost of the array substrate 000 is not increased.

In some embodiments, a height of each of the plurality of auxiliary isolation pillars 700 is less than or equal to a sum of a depth of the corresponding first via V1 and a depth of the corresponding second via V2. Illustratively, in the case that the height of the auxiliary isolation pillar 700 is less than the sum of the depth of the corresponding first via V1 and the depth of the corresponding second via V2, a recess structure is present at a position, disposed with the auxiliary isolation pillar 700, of the array substrate 000. In the case that the height of the auxiliary isolation pillar 700 is equal to the sum of the depth of the corresponding first via V1 and the depth of the corresponding second via V2, a face, facing away from the base substrate 100, of the auxiliary isolation pillar 700 is flush with a face, facing away from the base substrate 100, of the second passivation layer 500. In this case, the height of the auxiliary isolation pillar 700 is less than or equal to the sum of the depth of the corresponding first via V1 and the depth of the corresponding second via V2, such that the position, disposed with the auxiliary isolation pillar 700, of the array substrate 000 does not affect the normal distribution of the liquid crystal molecules in the liquid crystal panel upon forming of the liquid crystal panel by attaching the array substrate 000 and the cover plate.

Figure 5:
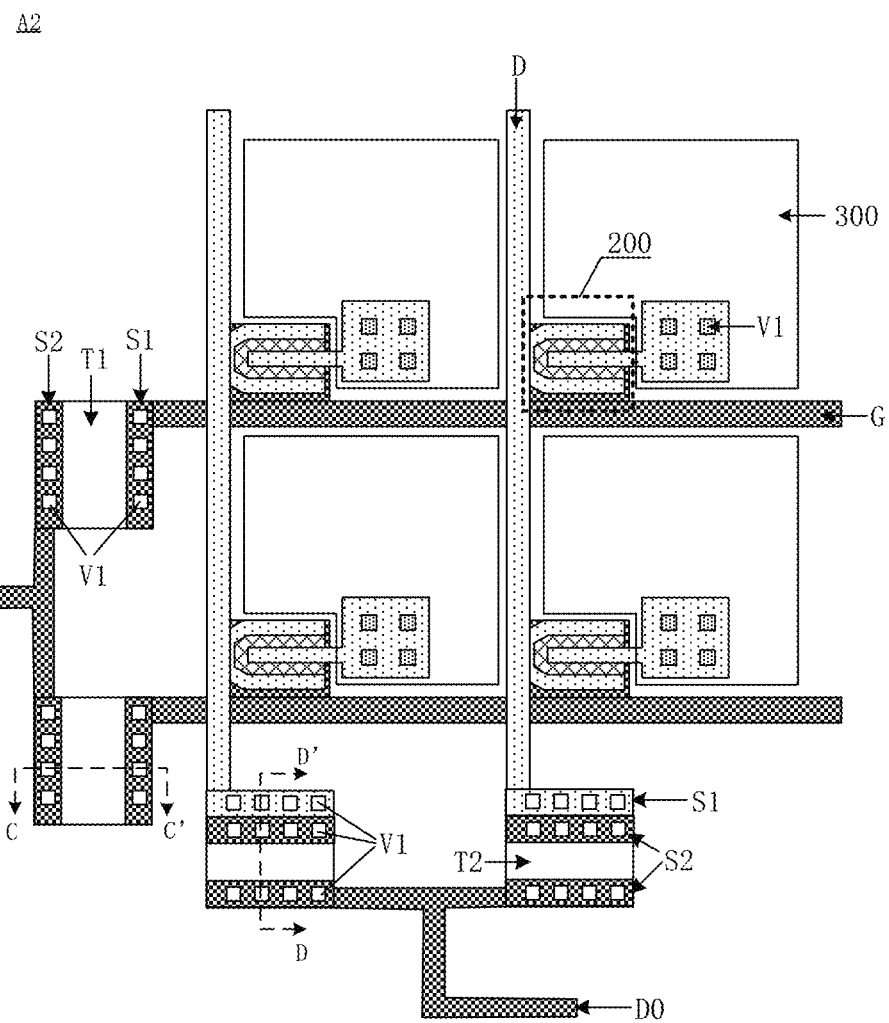
FIG. 5 is a locally enlarged diagram of the array substrate shown in FIG. 1 at A2.
Figure 6:
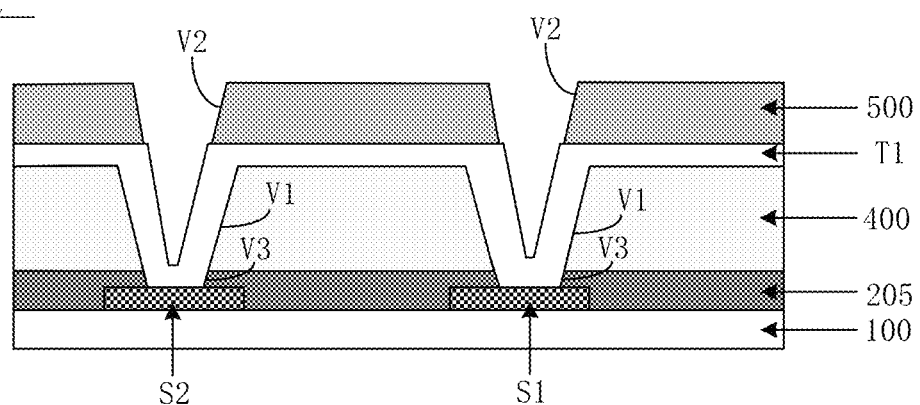
FIG. 6 is a schematic diagram of film layers of the array substrate shown in FIG. 5 at C-C'.

In a second aspect, for the first via V1 in the non-display region 00b, as shown in FIG. 5 and FIG. 6, FIG. 5 is a locally enlarged diagram of the array substrate shown in FIG. 1 at A2, and FIG. 6 is a schematic diagram of film layers of the array substrate shown in FIG. 5 at C-C'. The array substrate further includes a first electrode S1, a second electrode S2, and a first transparent connecting electrode T1 that are disposed in the non-display region 00b. The first transparent connecting electrode T1 and the pixel electrode 300 are disposed in the same layer and made of the same material.

The first transparent connecting electrode T1 is in contact with the first electrode S1 through one part of the plurality of first vias V1 in the non-display region 00b, and is in contact with the second electrode S2 through the other part of the plurality of first vias V1 in the non-display region 00b.

In the embodiments of the present disclosure, there are many cases of disposing the first electrode S1 and the second electrode S2 in the non-display region 00b, and the embodiments of the present disclosure are illustrated in the following three cases.

In a first case, as shown in FIG. 5 and FIG. 6, the first electrode S1, the second electrode S2, and the gate 203 of the thin-film transistor 200 are disposed in the same layer and made of the same material. That is, the first electrode S1 and the second electrode S2 are part of the gate metal layer.

In this case, the first electrode S1 is electrically connected to the gate line G in the display region 00a, and the second electrode S2 is electrically connected to a gate signal output terminal G0 in the non-display region 00b. As the first electrode S1 is electrically connected to the second electrode S2 through the first transparent connecting electrode T1, a gate signal output by the gate signal output terminal G0 is transmitted to the gate line G through the second electrode S2, the first transparent connecting electrode T1, and the first electrode S1.

It should be noted that the static electricity is easily accumulated in forming the gate metal layer in the array substrate 000 by the one patterning process in the case that an area of an orthogonal projection of the gate metal layer on the base substrate 100 is great, such that a gate insulative layer 205 sequentially formed in the gate metal layer is prone to the poor phenomenon of electrostatic breakdown. Thus, the area of the orthogonal projection of the gate metal layer on the base substrate 100 is reduced by removing the metal portion between the first electrode S1 and the second electrode S2, such that a possibility of the poor phenomenon of electrostatic breakdown in the sequentially formed gate insulative layer 205 is reduced. Thus, the first electrode S1 and the second electrode S2 are conducted through the first transparent connecting electrode T1 disposed on the same layer and made of the same material as the pixel electrode 300, such that the gate signal output terminal G0 electrically connected to the second electrode S2 transmits the gate signal to the gate line G electrically connected to the first electrode S1.

In the embodiments of the present disclosure, as the gate metal layer is disposed on a side, proximal to the base substrate 100, of the gate insulative layer 205, a third via V3 connected to the first via V1 requires to be disposed in the gate insulative layer 205 to ensure that the first transparent connecting electrode T1 is in contact with the first electrode S1 (or the second electrode S2) through the first via V1 and the third via V3. It should be noted that in manufacturing the array substrate 000, a patterning process is not required upon forming the gate insulative layer 205, and the subsequent film layers are directly formed. The third via V3 connected to the first via V1 is formed in the gate insulative layer 205 upon forming of the first via V1 in the first passivation layer 400 and etching of gate insulative layer 205.

In the present disclosure, a gate driven on array (GOA) circuit is disposed in the non-display region 00b, and a signal output terminal of the GOA circuit is the gate signal output terminal G0. As shown in FIG. 1, a gate driving chip 004 is bonded in the non-display region 00b, and a plurality of output weld legs of the gate driving chip 004 are electrically connected to a plurality of gate signal output terminals G0 in the non-display region 00b in one-to-one correspondence. As such, the GOA circuit or the gate driving chip 004 transmits the gate signal to the gate line G by the plurality of gate signal output terminals G0, the first electrode S1, the first transparent connecting electrode T1, and the second electrode S2.

Figure 7:
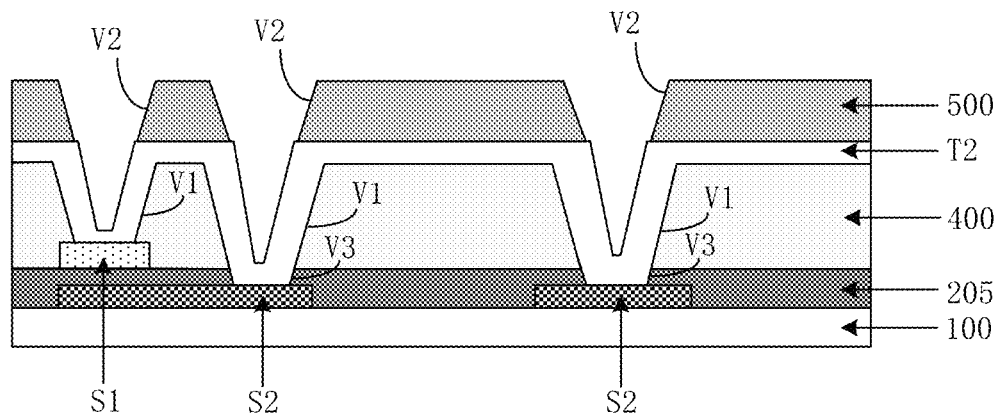
FIG. 7 is a schematic diagram of another film layers of the array substrate shown in FIG. 5 at D-D'.

In a second case, as shown in FIG. 5 and FIG. 7, FIG. 7 is a schematic diagram of another film layers of the array substrate shown in FIG. 5 at D-D'. The first electrode S1 and the source 201 and the drain 202 of the thin-film transistor 200 are disposed in the same layer and made of the same material. That is, the first electrode S1 is part of the source and drain metal layer. The second electrode S2 and the gate 203 of the thin-film transistors 200 are disposed in the same layer and made of the same material. That is, the second electrode S2 is part of the gate metal layer.

In this case, the first electrode S1 is electrically connected to the data line D in the display region 00a, and the second electrode S2 is electrically connected to a data signal output terminal DO in the non-display region 00b. As the first electrode S1 is electrically connected to the second electrode S2 through the second transparent connecting electrode T2, a data signal output by the data signal output terminal DO is transmitted to the data line D through the second electrode S2, the second transparent connecting electrode T2, and the first electrode S1.

It should be noted that as the data signal output terminal DO in the non-display region 00b is the part of the gate metal layer, the second electrode S2 is directly and electrically connected to the data signal output terminal DO in the case that the second electrode S2 is the part of the gate metal layer. As the data line D in the display region 00a and the first electrode S1 are part of the source and drain metal layer, the data line D is directly and electrically connected to the first electrode S1. Thus, the first electrode S1 and the second electrode S2 not disposed in the same layer are conducted through the second transparent connecting electrode T2 disposed on the same layer and made of the same material as the pixel electrode 300, such that the data signal output terminal DO electrically connected to the second electrode S2 transmits the data signal to the data line D electrically connected to the first electrode S1.

It should be noted that an isolation structure is disposed in the first electrode S1 to reduce the area of the orthogonal projection of the gate metal layer on the base substrate 100, such that the first electrode S1 is isolated into to two portions. The principles are referred to the corresponding portion in the above embodiments, which are not repeated in the embodiments of the present disclosure.

It should be further noted that the third via V3 connected to the first via V1 is disposed in the gate insulative layer 205, and the functions of the third via V3 are referred to the corresponding portion in the above embodiments, which are not repeated in the embodiments of the present disclosure.

In the present disclosure, as shown in FIG. 1, a source driving chip 005 is bonded in the non-display region 00b, and a plurality of output weld legs of the source driving chip 005 are electrically connected to a plurality of data signal output terminals DO in the non-display region 00b in one-to-one correspondence. As such, the source driving chip 005 transmits the data signal to the data line D by the plurality of data signal output terminals DO, the first electrode S1, the first transparent connecting electrode T1, and the second electrode S2.

It should be noted that as shown in FIG. 5, one data signal output terminal DO is connected to two data lines D, and one gate signal output terminal G0 is connected to two gate lines G. As such, the pixel voltage is supplied to 2*2 pixel electrodes 300 under the control of the one data signal output terminal DO and the one gate signal output terminal G0. Thus, such array substrate is used to manufacture the liquid crystal handwriting board.

As a width of handwriting in writing on the liquid crystal handwriting board by the writing tool is great, and a width of the pixel sub-region of the pixel electrode 300 is less, for a great efficiency of erasing the handwriting, a region of each 2*2 pixel electrodes 300 forms a minimum erasing region, the pixel voltage is supplied to the 2*2 pixel electrodes 300 in the minimum erasing region in the case that the liquid crystal handwriting board determines that the handwriting in the minimum erasing region requires to be erased, such that the handwriting in the minimum erasing region requires is erased.

In some embodiments, one data signal output terminal DO is connected to one or more data lines D, and one gate signal output terminal G0 is connected to one or more gate lines G, which are not limited in the embodiments of the present disclosure.

In a third case, as shown in FIG. 1, the array substrate 000 further includes an anti-electrostatic structure 800 in the non-display region 00b. The first electrode S1 and the second electrode S2 are two electrodes in the anti-electrostatic structure 800.

Figure 8:
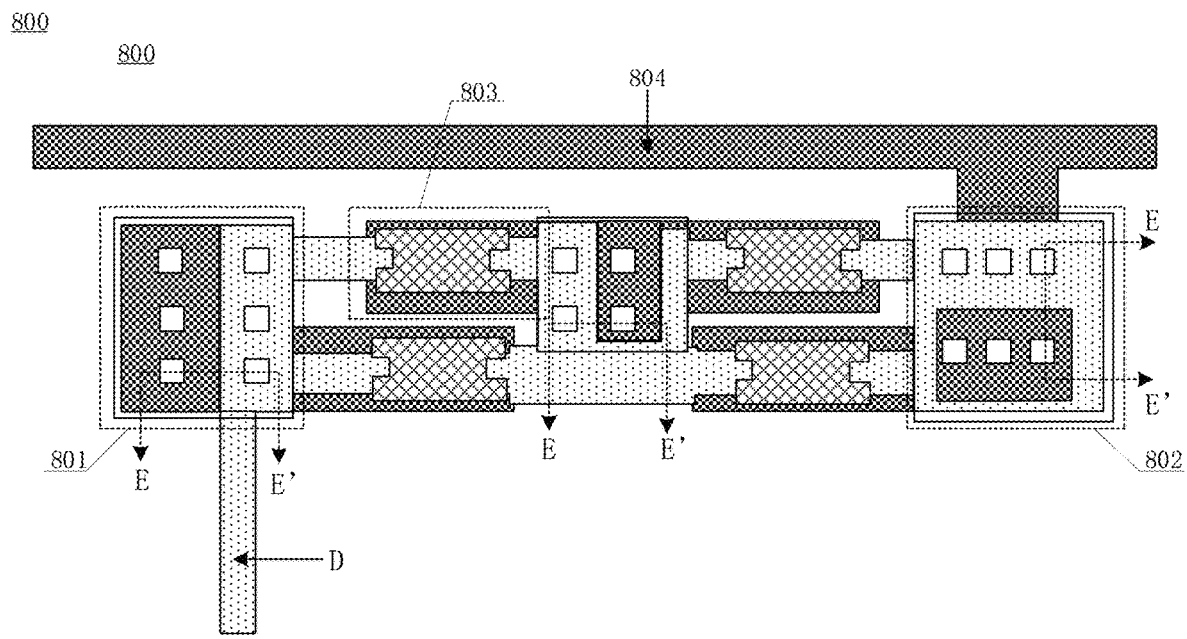
FIG. 8 is a locally enlarged diagram of an anti-electrostatic structure shown in FIG. 1.

In the embodiments of the present disclosure, as shown in FIG. 8, FIG. 8 is a locally enlarged diagram of an anti-electrostatic structure shown in FIG. 1. The anti-electrostatic structure 800 includes a first electrostatic discharging electrode 801 and a second electrostatic discharging electrode 802, and a plurality of cascaded electrostatic discharging (that is, electro-electrostatic discharge, ESD) diodes 803 between the first electrostatic discharging electrode 801 and the second electrostatic discharging electrode 802. The ESD diode 803 includes a first electrode, a second electrode, a semiconductor layer, and a third electrode. The first electrode and the second electrode of the ESD diode 803 and the source 201 and the drain 202 of the thin-film transistor 200 are disposed in the same layer and made of the same material, and the first electrode and the second electrode are in contact with the semiconductor layer. The third electrode of the ESD diode 803 and the gate 203 of the thin-film transistor 200 are disposed in the same layer and made of the same material, and the third electrode is insulated from the semiconductor layer. The semiconductor layer of the ESD diode 803 and the active layer of the thin-film transistor 200 are disposed in the same layer and made of the same material The first electrode of the ESD diode 803, proximal to the first electrostatic discharging electrode 801, in the plurality of ESD diodes 803 is electrically connected to the first electrostatic discharging electrode 801, and the second electrode of the ESD diode 803, proximal to the second electrostatic discharging electrode 802, in the plurality of ESD diodes 803 is electrically connected to the second electrostatic discharging electrode 802.

In the present disclosure, the first electrostatic discharging electrode 801 is electrically connected to the gate line G or the data line D in the display region 00a, and the second electrostatic discharging electrode 802 is electrically connected to an electrostatic discharging signal line 804. The electrostatic discharging signal line 804 is a signal connecting electrode S3 in the following embodiments. It should be noted that as an end of the gate line G requires to be electrically connected to the gate signal output terminal G0, the anti-electrostatic structure 800 electrically connected to gate line G requires to be connected from an end, facing away from the gate signal output terminal G0, of gate line G. Similarly, as an end of the data line D requires to be electrically connected to the data signal output terminal DO, the anti-electrostatic structure 800 electrically connected to data line D requires to be connected from an end, facing away from the data signal output terminal DO, of data line D. It should be noted that FIG. 8 is illustrated by taking the anti-electrostatic structure 800 electrically connected to data line D as an example.

In the case that the electrostatic is generated in using the array substrate 000, an electrostatic charge is transmitted to the first electrostatic discharging electrode 801 in the anti-electrostatic structure 800 through the gate line G or the data line D, such that a coupling capacitance is generated between the first electrode and the third electrode of the ESD diode 803 electrically connected to the first electrostatic discharging electrode 801. In the case that charges on the third electrode are accumulated to a conducted current value of the ESD diode 803, the third electrode conducts an active layer in the ESD diode 803, and the accumulated electrostatic charges are discharged to the electrostatic discharging signal line 804 through the second electrode of the ESD diode 803 and the second electrostatic discharging electrode 802, such that the electrostatic generated in the array substrate 000 is discharged, and the array substrate 000 is protected.

In the embodiments of the present disclosure, the first electrode S1 and the source 201 and the drain 202 of the thin-film transistor 200 are disposed in the same layer and made of the same material. That is, the first electrode S1 is part of the source and drain metal layer. The second electrode S2 and the gate 203 of the thin-film transistors 200 are disposed in the same layer and made of the same material. That is, the second electrode S2 is part of the gate metal layer. The first electrode S1 and the second electrode S2 are two electrodes disposed in different layers and electrically connected in the anti-electrostatic structure 800.

Figure 9:
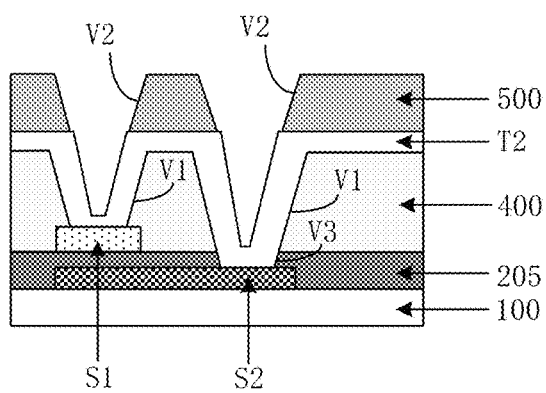
FIG. 9 is a schematic diagram of film layers of the anti-electrostatic structure shown in FIG. 8 at E-E'.

It should be noted that there are many positions of two electrodes disposed in different layers and electrically connected in the anti-electrostatic structure 800. For example, as shown in FIG. 9, FIG. 9 is a schematic diagram of film layers of the anti-electrostatic structure shown in FIG. 8 at E-E'. The first electrode S1 and the second electrode S2 are disposed in the first electrostatic discharging electrode 801, the second electrostatic discharging electrode 802, or the electrode for cascading two adjacent ESD diode 803 in the anti-electrostatic structure 800.

In the present disclosure, in attaching the array substrate 000 and the cover plate, the foreign matter between the array substrate 000 and the cover plate is in contact with the first transparent connecting electrode T1 upon passing through the second vias V2 in the second passivation layer 500 in the non-display region 00b. Thus, for reduction the possibility of conducting the first transparent connecting electrode T1 and the common electrode layer by the foreign matter between the array substrate 000 and the cover plate in attaching the array substrate 000 and the cover plate, the embodiments similar to the above embodiments are implemented, which are not repeated in the embodiments of the present disclosure.

Figure 10:
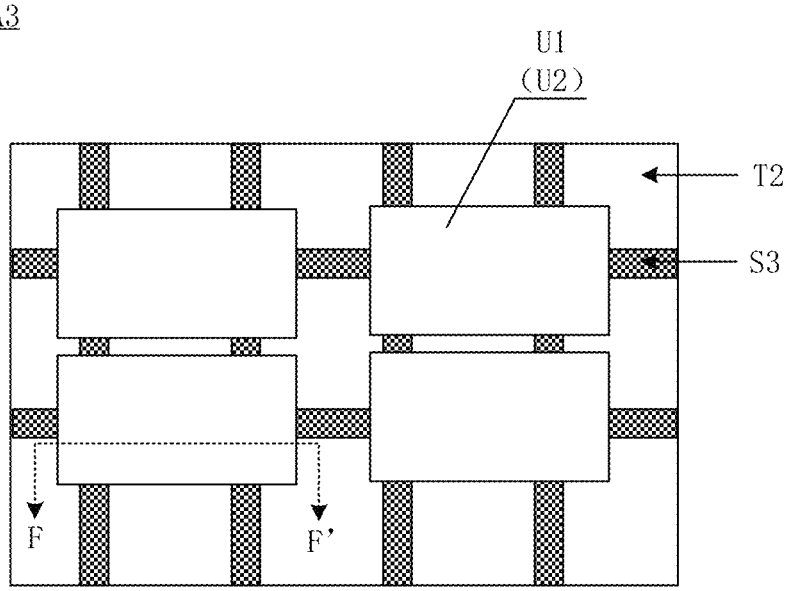
FIG. 10 is a locally enlarged diagram of the array substrate shown in FIG. 1 at A3.
Figure 11:
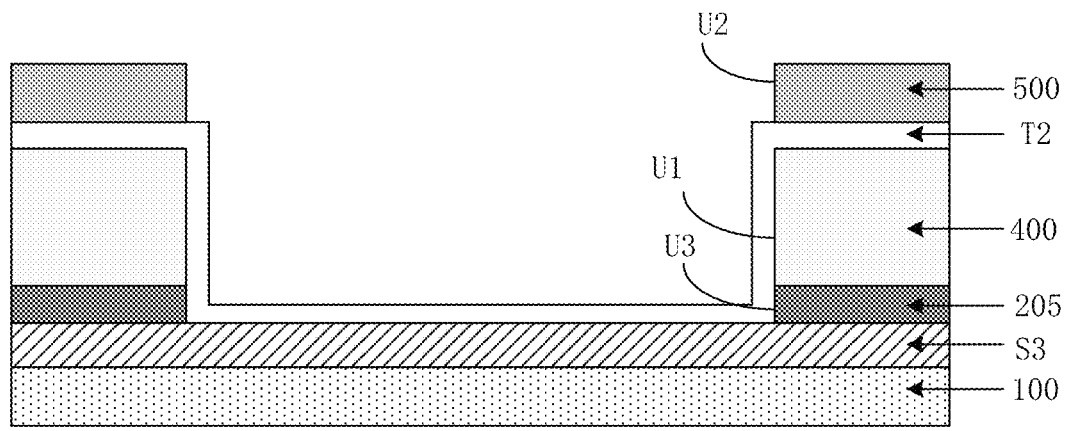
FIG. 11 is a schematic diagram of film layers of the array substrate shown in FIG. 10 at F-F'.

In some embodiments, as shown in FIG. 1, FIG. 10, and FIG. 11, FIG. 10 is a locally enlarged diagram of the array substrate shown in FIG. 1 at A3, and FIG. 11 is a schematic diagram of film layers of the array substrate shown in FIG. 10 at F-F'. A first hollow cavity U1 in the non-display region 00b is further defined in the first passivation layer 400, and a second hollow cavity U2 in the non-display region 00b is further defined in the second passivation layer 500. An overlapped region is present between an orthogonal projection of the second hollow cavity U2 on the base substrate 100 and an orthogonal projection of the first hollow cavity U1 on the base substrate 100. Illustratively, the orthogonal projection of the second hollow cavity U2 on the base substrate 100 is within the orthogonal projection of the first hollow cavity U1 on the base substrate 100.

In some embodiments of the present disclosure, as shown in FIG. 2, FIG. 10, and FIG. 11, the array substrate 000 further includes an auxiliary signal line G1 in the display region 00a, and a signal connecting electrode S3 and a second transparent connecting electrode T2 in the non-display region 00b.

An overlapped region is present between an orthogonal projection of the auxiliary signal line G1 in the array substrate 000 on the base substrate 100 and an orthogonal projection of the pixel electrode 300 on the base substrate 100. The auxiliary signal line G1 and the gate line G are disposed in the same layer and made of the same material, and an extension direction of the auxiliary signal line G1 is parallel to an extension direction of the gate line G. The auxiliary signal line G1 and each pixel electrode 300 in one row of the pixel electrodes 300 form a storage capacitor, and the storage capacitor is used to maintain the pixel voltage of the pixel electrode 300.

The signal connecting electrode S3 in the array substrate 000 and the auxiliary signal line G1 are disposed in the same layer and made of the same material, the signal connecting electrode S3 is electrically connected to the auxiliary signal line G1, and an overlapped region is present between an orthogonal projection of the signal connecting electrode S3 on the base substrate 100 and the orthogonal projection of the first hollow cavity U1 on the base substrate 100.

The second transparent connecting electrode T2 in the array substrate 000 and the pixel electrode 300 are disposed in the same layer and made of the same material. An overlapped region is present between an orthogonal projection of the second transparent connecting electrode T2 on the base substrate 100 and the orthogonal projection of the first hollow cavity U1 on the base substrate 100, such that the second transparent connecting electrode T2 is in contact with the signal connecting electrode S3 in the first hollow cavity U1.

In some embodiments of the present disclosure, a potential of the auxiliary signal line G1 in the display region 00a requires to be equal to a potential of the common electrode layer in the cover plate in the sequentially formed liquid crystal panel. Thus, the auxiliary signal line G1 is in contact with the common electrode layer in the cover plate through the signal connecting electrode S3 in the non-display region 00b and the second transparent connecting electrode T2, such that the potential of the common electrode layer is the same as the potential of the auxiliary signal line G1.

Illustratively, a side, facing away from the base substrate 100, of the second transparent connecting electrode T2 is exposed from the second hollow cavity U2. As such, the side, facing away from the base substrate 100, of the second transparent connecting electrode T2 is in contact with the common electrode layer in the cover plate through a conductive connecting structure. At least part of the conductive connecting structure is within the second hollow cavity U2. Thus, the auxiliary signal line G1 is in contact with the common electrode layer in the cover plate through the signal connecting electrode S3, the second transparent connecting electrode T2, and the conductive connecting structure in the second hollow cavity U2.

Figure 12:
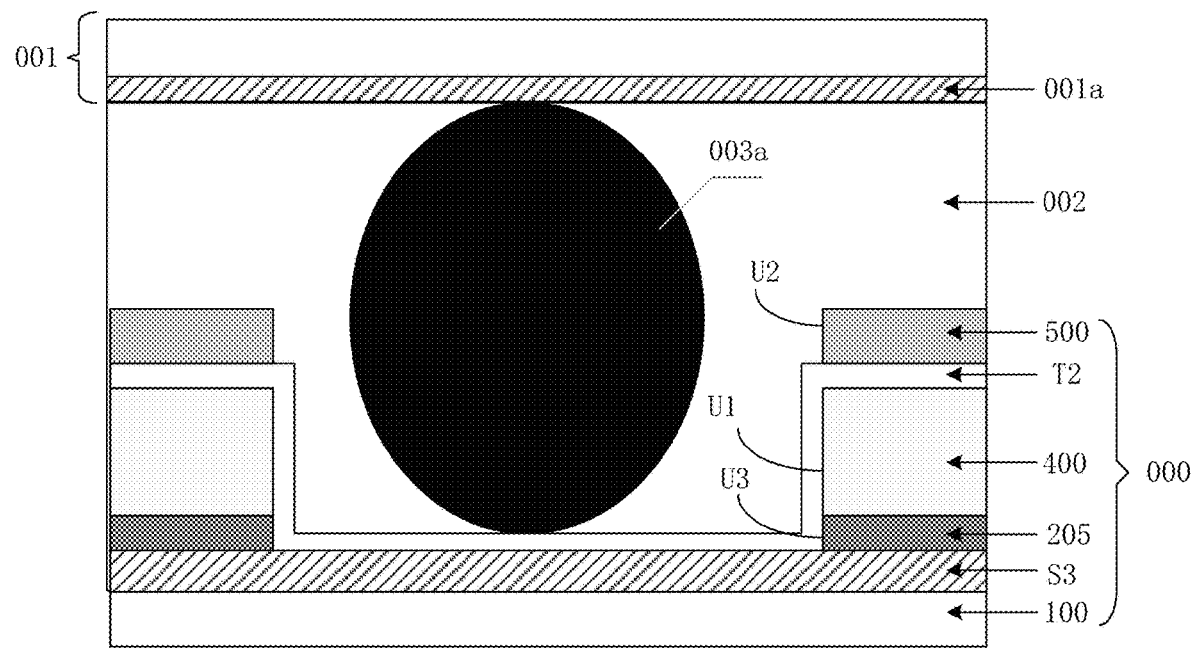
FIG. 12 is a schematic diagram of film layers of a liquid crystal panel according to some embodiments of the present disclosure at F-F'.

In some embodiments, as shown in FIG. 1, the non-display region 00b includes an annular sealing region 00c. As shown in FIG. 12, FIG. 12 is a schematic diagram of film layers of a liquid crystal panel according to some embodiments of the present disclosure at F-F'. Prior to attaching the array substrate 000 and the cover plate 001, a sealant 002 is coated on the sealing region 00c, such that the attached array substrate 000 and cover plate 00 are connected through the sealant 002. An orthogonal projection of the sealant 002 on the base substrate 100 is overlapped with the orthogonal projection of the first hollow cavity U1 on the base substrate 100. As such, a metal conductive ball 002a is filled in a portion, corresponding to the first hollow cavity U1, of the sealant 002, such that the metal conductive ball 002a is in contact with the common electrode layer 001a in the cover plate 001 upon connection of the array substrate 000 and the cover plate 001 through the sealant 002, and at least part of the metal conductive ball 002a is disposed in the second hollow cavity U2 and in contact with the second transparent connecting electrode T2. Thus, the metal conductive ball 002a filled in the sealant 002 is the conductive connecting structure.

It should be noted that a size of the second hollow cavity U2 in the second passivation layer 500 requires to be great, such that at least part of the metal conductive ball 002a filled in the sealant 002 is disposed in the second hollow cavity U2.

In the embodiments of the present disclosure, the first passivation layer 400 further includes at least one strip-shaped first hollow cavity U1 and/or a plurality of block-shaped first hollow cavities U1. The embodiments of the present disclosure are illustrated in the following two implementations.

In a first implementation, as shown in FIG. 10 and FIG. 11, in the case that the first passivation layer 400 includes a plurality of block-shaped first hollow cavities U1, one part of the second transparent connecting electrode T2 is within the orthogonal projection of the first hollow cavity U1 on the base substrate 100, and the other part of the second transparent connecting electrode T2 is beyond the orthogonal projection of the first hollow cavity U1 on the base substrate 100. The block-shaped first hollow cavity U1 indicates that the orthogonal projection of the first hollow cavity U1 on the base substrate 100 is block-shaped. For example, the orthogonal projection of the first hollow cavity U1 on the base substrate 100 is a rectangle with the approximately equal long side and short side.

In this case, the second passivation layer 500 includes a plurality of block-shaped second hollow cavities U2, the plurality of second hollow cavities U2 are in one-to-one correspondence to the plurality of first hollow cavities U1, and an orthogonal projection of each second hollow cavity U2 on the base substrate 100 is within the orthogonal projection of the corresponding first hollow cavity U1 on the base substrate 100. A width of an opening, facing away from the base substrate 100, of the second hollow cavity U2 in any direction parallel to the base substrate 100 ranges from 50 microns to 1000 microns. As such, the size of the second hollow cavity U2 is great, such that at least part of the conductive connecting structure is disposed in the second hollow cavity U2 and is in contact with the second transparent connecting electrode T2.

Figure 13:
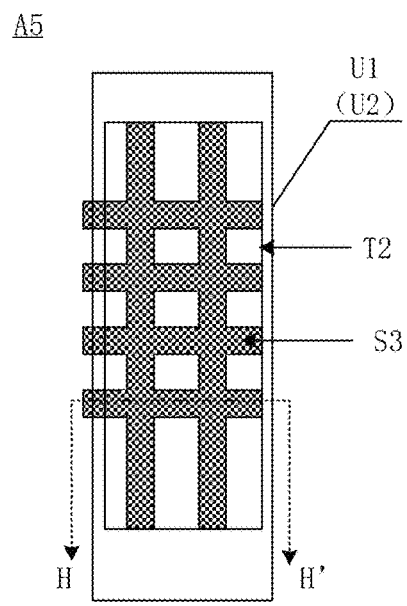
FIG. 13 is a locally enlarged diagram of the array substrate shown in FIG. 1 at A5.
Figure 14:
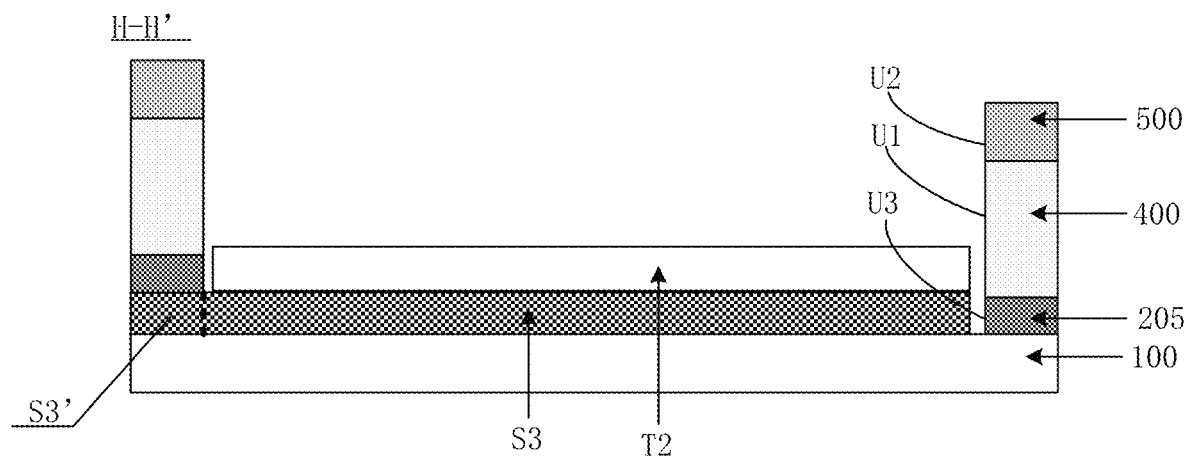
FIG. 14 is a schematic diagram of film layers of the array substrate shown in FIG. 13 at H-H'.

In a second implementation, as shown in FIG. 13 and FIG. 14, FIG. 13 is a locally enlarged diagram of the array substrate shown in FIG. 1 at A5, and FIG. 14 is a schematic diagram of film layers of the array substrate shown in FIG. 13 at H-H'. In the case that the first passivation layer 400 includes at least one strip-shaped first hollow cavity U1, the orthogonal projection of the second transparent connecting electrode T2 on the base substrate 100 is within the orthogonal projection of the first hollow cavity U1 on the base substrate 100. The strip-shaped first hollow cavity U1 indicates that the orthogonal projection of the first hollow cavity U1 on the base substrate 100 is strip-shaped. For example, the orthogonal projection of the first hollow cavity U1 on the base substrate 100 is a strip-shaped rectangle with the great difference between the long side and the short side.

In some embodiments, the first passivation layer 400 includes one strip-shaped first hollow cavity U1. In this case, the orthogonal projection of the first hollow cavity U1 on the base substrate 100 covers at least part of the sealing region 00c on an upper side and/or at least part of the sealing region 00c on a right side. For example, in the case that the orthogonal projection of the first hollow cavity U1 on the base substrate 100 covers at least part of the sealing region 00c on the upper side and at least part of the sealing region 00c on the right side, the orthogonal projection of the first hollow cavity U1 on the base substrate 100 is in a "L" shape composed of two stripes.

In some embodiments, the first passivation layer 400 includes two first hollow cavities U1. In this case, the orthogonal projection of one of the two first hollow cavities U1 on the base substrate 100 covers at least part of the sealing region 00c on an upper side, and the orthogonal projection of the other of the two first hollow cavities U1 on the base substrate 100 covers at least part of the sealing region 00c on a right side.

In this case, the second passivation layer 500 further includes at least one strip-shaped second hollow cavity U2, and the orthogonal projection of the at least one second hollow cavity U2 on the base substrate 100 is within the orthogonal projection of the first hollow cavity U1 on the base substrate 100. As such, the size of the second hollow cavity U2 is great, such that at least part of the conductive connecting structure is disposed in the second hollow cavity U2. In addition, the conductive connecting structure in the second hollow cavity U2 is uniform, such that a stable electrical connection between the auxiliary signal line G1 in the display region 00a and the common electrode layer in the cover plate is achieved.

In some embodiments, as shown in FIG. 14, a portion, not covered by the orthogonal projection of the first hollow cavity U1, of the signal connecting electrode S3 is also referred to as a jumper electrode S3', and the jumper electrode S3' is electrically connected to the auxiliary signal line G1 in the display region 00a. As such, the auxiliary signal line G1 is electrically connected to the portion, covered by the first hollow cavity U1, of the signal connecting electrode S3 by the jumper electrode S3'.

It should be noted that as shown in FIG. 11 and FIG. 14, the gate insulative layer 205 is provided with a connecting hollow cavity U3 connected to the first hollow cavity U1. The reason for disposing and process of forming the connecting hollow cavity U3 in the gate insulative layer 205 are referred to the reason for disposing and process of forming the third via V3 in the above embodiments, which are not repeated herein.

It should be further noted that the auxiliary signal line G1 in the display region 00a is electrically connected to the signal connecting electrode S3, and the orthogonal projection of the signal connecting electrode S3 on the base substrate 100 is gridding-shaped to reduce the area of the orthogonal projection of the signal connecting electrode S3 on the base substrate 100, such that the possibility of the poor phenomenon of electrostatic breakdown of film layers in manufacturing the array substrate 000 is reduced.

It should be further noted that the above embodiments are illustrated by taking a plurality of block-shaped first hollow cavities U1 being defined in a position of A3 in FIG. 1, and a plurality of strip-shaped first hollow cavities U1 being defined in a position of A5 in FIG. 1 as an example. In some embodiments, at least one strip-shaped first hollow cavity U1 is defined in the position of A3 and the position of A5. In some embodiments, a plurality of block-shaped first hollow cavities U1 are defined in the position of A3 and the position of A5. In some embodiments, at least one strip-shaped first hollow cavity U1 is defined in the position of A3, and a plurality of block-shaped first hollow cavities U1 are defined in the position of A5, which are not limited in the embodiments of the present disclosure.

Figure 15:
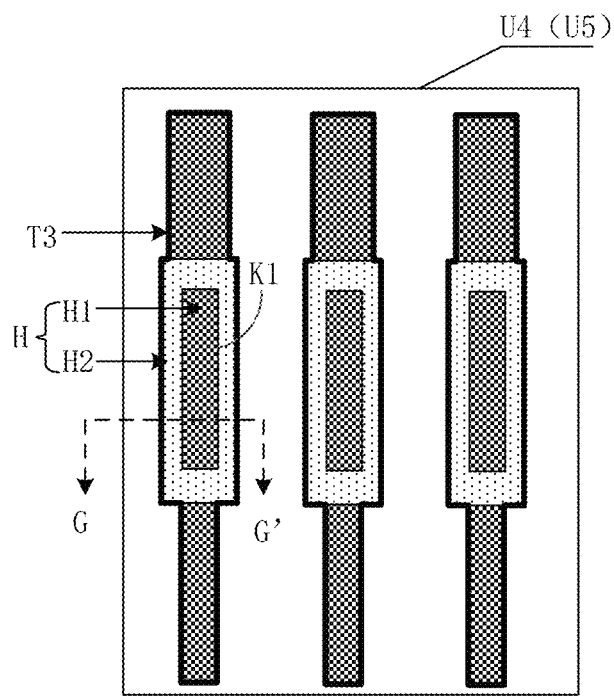
FIG. 15 is a locally enlarged diagram of the array substrate shown in FIG. 1 at A4.
Figure 16:
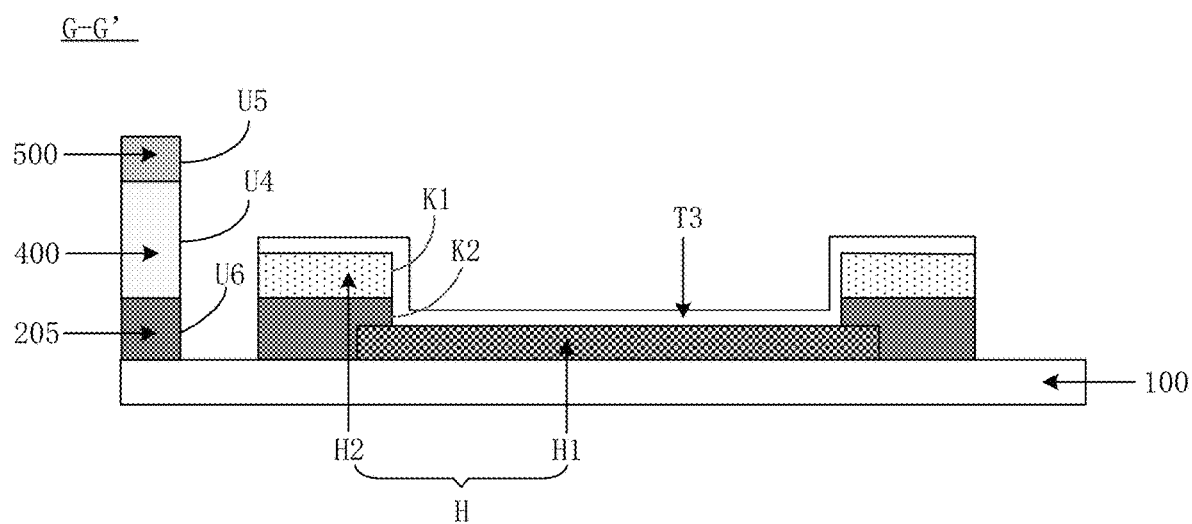
FIG. 16 is a schematic diagram of film layers of the array substrate shown in FIG. 15 at G-G'.

In some embodiments, as shown in FIG. 1, FIG. 15, and FIG. 16, FIG. 15 is a locally enlarged diagram of the array substrate shown in FIG. 1 at A4, and FIG. 16 is a schematic diagram of film layers of the array substrate shown in FIG. 15 at G-G'. A first connecting cavity U4 in the non-display region 00b is further defined in the first passivation layer 400, and a second connecting cavity U5 in the non-display region 00b is further defined in the second passivation layer 500. An overlapped region is present between an orthogonal projection of the second connecting cavity U5 on the base substrate 100 and an orthogonal projection of the first connecting cavity U4 on the base substrate 100. Illustratively, the orthogonal projection of the second connecting cavity U5 on the base substrate 100 is within the orthogonal projection of the first connecting cavity U4 on the base substrate 100. In some embodiments, the first connecting cavities U4 and the first hollow cavities U1 are oppositely disposed on two sides of the display region 00a. Illustratively, the first hollow cavities U1 are disposed on one set of adjacent side edges proximal to the display region 00a, for example, a right side and an upper side proximal to the display region 00a in FIG. 1. The first connecting cavities U4 are disposed on the other set of adjacent side edges proximal to the display region 00a, for example, a lower side and a left side proximal to the display region 00a in FIG. 1. It should be noted that in the case that the non-display region 00b is disposed with the GOA circuit, and the GOA circuit is disposed on the left side proximal to the display region 00a, the first connecting cavity U4 merely requires to be disposed on the lower side proximal to the display region 00a.

In the embodiments of the present disclosure, as shown in FIG. 1, FIG. 15, and FIG. 16, the array substrate 000 further includes a plurality of signal lines in the display region 00a, and a plurality of pads H and a plurality of third transparent connecting electrodes T3 in the non-display region 00b.

The plurality of signal lines in the array substrate 000 are electrically connected to the plurality of pads H in one-to-one correspondence. In some embodiments, the plurality of pads are bonded to the driving chip, and the driving chip is the gate driving chip 004 or the source driving chip 005. In the case that the array substrate 000 requires to bond the gate driving chip and the source driving chip 005, the signal line in the display region 00a is the gate line G or the data line D. As such, the gate line G is electrically connected to the gate driving chip 004 through the pad H, such that the gate driving chip 004 transmits the gate signal to the gate line G through the pad H. The data line D is electrically connected to the source driving chip 005 through the pad H, such that the source driving chip 005 transmits the data signal to the data line D through the pad H. In the case that the array substrate 000 only requires to bond the source driving chip 005, the signal line in the display region 00a is the data line D, and the data line D is electrically connected to the source driving chip 005 through the pad H.

An overlapped region is present between an orthogonal projection of each of the plurality of pads H in the array substrate 000 on the base substrate 100 and the orthogonal projection of the first connecting cavity U4 on the base substrate 100.

The plurality of third transparent connecting electrodes T3 in the array substrate 000 and the pixel electrode 300 are disposed in the same layer and made of the same material, the plurality of third transparent connecting electrodes T3 are in one-to-one correspondence to the plurality of pads H, and an overlapped region is present between an orthogonal projection of each of the plurality of third transparent connecting electrodes T3 on the base substrate 100 and the orthogonal projection of the first connecting cavity U4 on the base substrate 100. As such, each of the plurality of third transparent connecting electrodes T3 is in contact with the corresponding pad H in the first connecting cavity U4. Illustratively, a boundary of the orthogonal projection of each of the plurality of pads H on the base substrate 100 is coincided with a boundary of the orthogonal projection of the corresponding third transparent connecting electrode T3 on the base substrate 100.

In some embodiments, the pad H includes a first sub-pad H1 and a second sub-pad H2 that are laminated. In the present disclosure, the third transparent connecting electrode T3 is in contact with the first sub-pad H1 and the second sub-pad H2. The first sub-pad H1 and the gate line G are disposed in the same layer and made of the same material, and the second sub-pad H2 and the data line D are disposed in the same layer and made of the same material. That is, the first sub-pad H1 in the pad H is part of the gate metal layer, and the second sub-pad H2 in the pad H is part of the source and drain metal layer. As such, in the case that the pad H is formed by two different layers of the metal layers, the whole height of the pad H is great, such that the driving chip is easily bonded to the array substrate 000 in the sequentially bonding process of the driving chip.

Illustratively, the second sub-pad H2 includes a first auxiliary hollow cavities K1, and an orthogonal projection of the first auxiliary hollow cavity K1 on the base substrate 100 is within the orthogonal projection of the first sub-pad H1 on the base substrate 100. In addition, as the gate insulative layer 205 is disposed between the gate metal layer and the source and drain metal layer, a second auxiliary hollow cavity K2 connected to the first auxiliary hollow cavity K1 requires to be disposed in the gate insulative layer 205. As such, part of the third transparent connecting electrode T3 is in contact with the first sub-pad H1 by sequentially passing through the first auxiliary hollow cavity K1 and the second auxiliary hollow cavity K2, and a portion, beyond the first auxiliary hollow cavity K1, of the third transparent connecting electrode T3 is in contact with the second sub-pad H2. As such, the third transparent connecting electrode T3 is in contact with the first sub-pad H1 and the second sub-pad H2.

In some embodiments of the present disclosure, a side, facing away from the base substrate 100, of pad H is exposed from the second connecting cavity U5, such that the side, facing away from the base substrate 100, of the pad H is in contact with the weld leg in the driving chip by an anisotropic conductive film (ACF). At least part of the ACF is within the second connecting cavity U5. Thus, the pad H is electrically connected to the weld leg in the driving chip by the ACF. It should be noted that a size of the second connecting cavity U5 in the second passivation layer 500 requires to be great, such that at least part of the ACF is disposed in the second connecting cavity U5 in bonding the driving chip on the array substrate 000.

In the embodiments of the present disclosure, one or a plurality of first connecting cavities U4 are disposed in the first passivation layer 400, and thus the embodiments of the present disclosure are illustrated in the following two implementations.

In a first implementation, as shown in FIG. 15 and FIG. 16, in the case that the first passivation layer 400 includes one first connecting cavity U4, orthogonal projections of the plurality of pads H in the array substrate 000 on the base substrate 100 are within the orthogonal projection of the first connecting cavity U3 on the base substrate 100.

In this case, only a portion, configured to disposing the plurality of pads H, in the first passivation layer 400 is removed, such that the difficulty of patterning the first passivation layer 400 is efficiently reduced. Correspondingly, one second connecting cavity U5 is disposed in the second passivation layer 500, and the orthogonal projection of the plurality of pads H on the base substrate 100 are within the orthogonal projection of the second connecting cavity U5 on the base substrate 100. As such, the ACF is disposed in the second connecting cavity U5 to be in contact with the pad H in bonding the driving chip on the array substrate 000.

Figure 17:
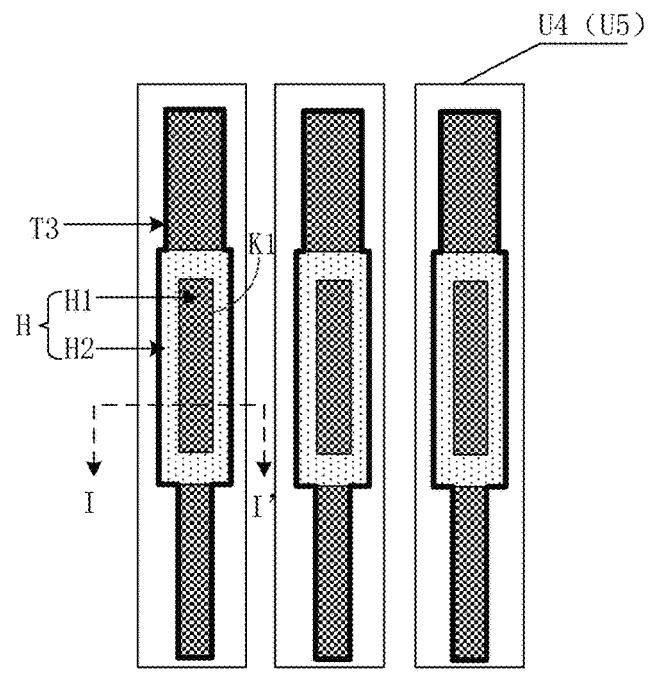
FIG. 17 is a locally enlarged diagram of the array substrate shown in FIG. 1 at A4.
Figure 18:
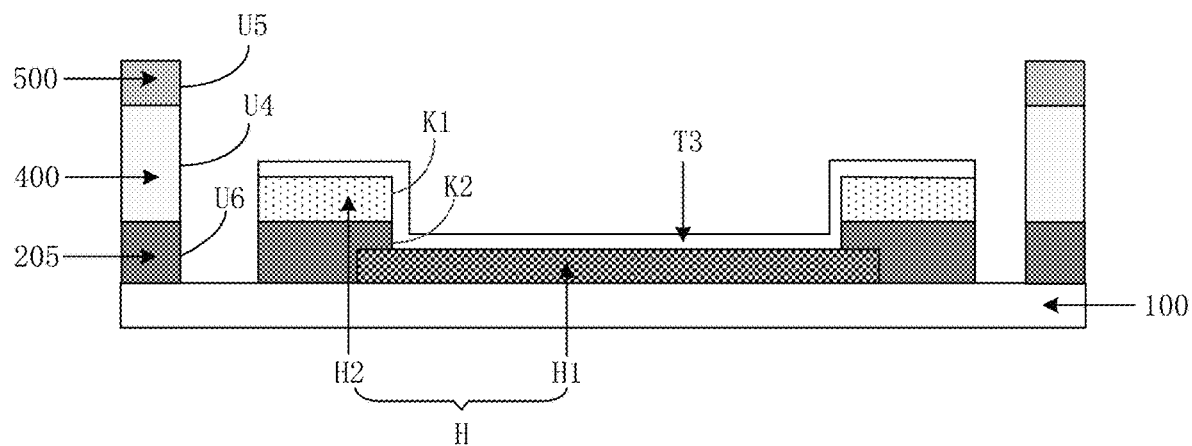
FIG. 18 is a schematic diagram of film layers of the array substrate shown in FIG. 17 at G-G'.

In a second implementation, as shown in FIG. 17 and FIG. 18, FIG. 17 is a locally enlarged diagram of the array substrate shown in FIG. 1 at A4, and FIG. 18 is a schematic diagram of film layers of the array substrate shown in FIG. 17 at G-G'. A plurality of first connecting cavities U4 are defined in the first passivation layer 400, the plurality of first connecting cavities U4 in the first passivation layer 400 are strip-shaped and are in one-to-one correspondence to the plurality of pads H, and an orthogonal projection of each of the plurality of pads H on the base substrate 100 is at least partially within an orthogonal projection of the corresponding first connecting cavity U4 on the base substrate 100.

In this case, a plurality of second connecting cavities U5 are defined in the second passivation layer 500. The plurality of second connecting cavities U5 are in one-to-one correspondence to the plurality of first connecting cavities U4, and an orthogonal projection of each of the plurality of second connecting cavities U5 on the base substrate 100 is within the orthogonal projection of the corresponding first connecting cavity U4 on the base substrate 100. A width of an opening, facing away from the base substrate 100, of the second connecting cavity U5 in any direction parallel to the base substrate 100 ranges from 50 microns to 120 microns. As such, the size of the second connecting cavity U5 is great, such that part of the ACF is disposed in the second connecting cavity U5.

In some embodiments, as shown in FIG. 17, a length of each first connecting cavity U4 is greater than a length of the corresponding pad H, such that the orthogonal projection of each pad H on the base substrate 100 is within the orthogonal projection of the corresponding first connecting cavity U4 on the base substrate 100.

Figure 19:
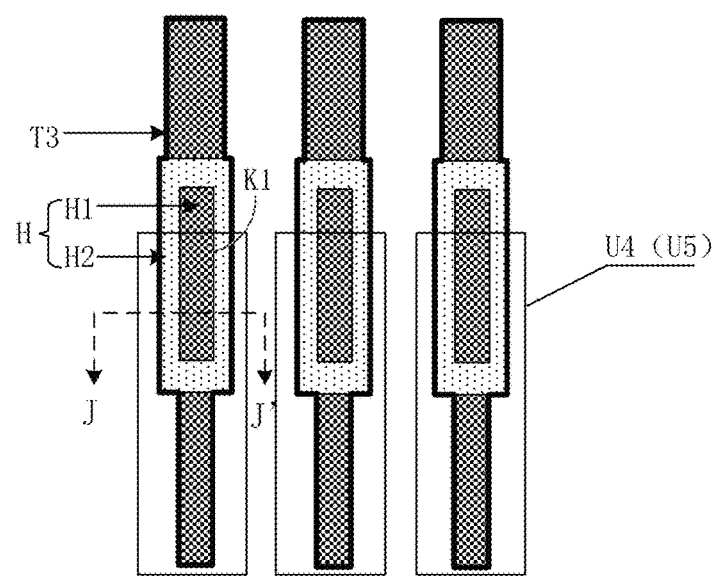
FIG. 19 is a locally enlarged diagram of the array substrate shown in FIG. 1 at A4.

In some embodiments, as shown in FIG. 19, FIG. 19 is a locally enlarged diagram of the array substrate shown in FIG. 1 at A4. A length of each first connecting cavity U4 is less than a length of the corresponding pad H, such that part of the orthogonal projection of each pad H on the base substrate 100 is within the orthogonal projection of the corresponding first connecting cavity U4 on the base substrate 100. Film layers of the array substrate shown in FIG. 19 at J-J' are referred to FIG. 18.

In the above two cases, at least part of each pad H is exposed from the corresponding second connecting cavity U5, such that the portion, exposed from the second connecting cavity U5, of the pad His in contact with the weld leg in the driving chip by the ACF.

In summary, the array substrate in the embodiments of the present disclosure incudes a base substrate, and a pixel electrode, a thin-film transistor, a first passivation layer, and a second passivation layer that are disposed on a side of the base substrate. As the second passivation layer is disposed on the side, facing away from the base substrate, of the pixel electrode, in forming the liquid crystal panel by attaching the array substrate and the cover plate, even if foreign matter is introduced to a position between the array substrate and the cover plate, the foreign matter does not conduct the pixel electrode in the array substrate and the common electrode layer in the cover plate based on insulation of the second passivation layer on the side, facing away from the base substrate, of the pixel electrode, such that a poor phenomenon of abnormal display or failure of erasing handwriting exists in the sequentially acquired liquid crystal panel is avoided, and the display effect of the liquid crystal panel is great. In addition, as a portion, in the display region, of the plurality of first vias in the first passivation layer is in one-to-one correspondence to a portion, in the display region, of the plurality of second vias in the second passivation layer, and an overlapped region is present between an orthogonal projection of the second via on the base substrate and an orthogonal projection of the corresponding first via on the base substrate, the mask plate used in forming the plurality of first vias in the first passivation layer is the same as the mask plate used in forming the plurality of second vias in the second passivation layer. As such, in manufacturing the array substrate, it is not necessary to specially develop and produce the mask plate corresponding to the second passivation layer, and thus the manufacturing cost of the array substrate is efficiently reduced.

The embodiments of the present disclosure further provide a method for manufacturing an array substrate. The method for manufacturing the array substrate is applicable to the array substrate shown in the above embodiments. The method for manufacturing the array substrate includes:

sequentially forming a thin-film transistor, a first passivation layer, a pixel electrode, and a second passivation layer on a side of the base substrate.

The array substrate is provided with a display region and a non-display region on a periphery of the display region, the pixel electrode and the thin-film transistor are disposed in the display region, and the pixel electrode is disposed on a side, facing away from the base substrate, of the thin-film transistor. The first passivation layer is disposed between the pixel electrode and the thin-film transistor, a plurality of first vias are defined in the first passivation layer, at least part of the plurality of first vias are disposed in the display region, and the pixel electrode is electrically connected to the thin-film transistor through the at least part of the plurality of first vias in the display region. The second passivation layer is disposed on a side, facing away from the base substrate, of the pixel electrode, a plurality of second vias are defined in the second passivation layer, at least part of the plurality of second vias are disposed in the display region, the at least part of the plurality of second vias in the display region are in one-to-one correspondence to the at least part of the plurality of first vias in the display region, and an overlapped region is present between an orthogonal projection of each of the at least part of the plurality of second vias in the display region on the base substrate and an orthogonal projection of the corresponding first via on the base substrate.

In some embodiments, the first passivation layer is acquired by patterning an insulative thin film on the side, facing away from the base substrate, of the thin-film transistor using a target mask plate, and the second passivation layer is acquired by patterning an insulative thin film on the side, facing away from the base substrate, of the pixel electrode using the target mask plate.

It should be noted that the structure and principles of the array substrate in the above embodiments are referred to as the descriptions of the array substrate in the above embodiments, which are not repeated herein.

The embodiments of the present disclosure further provide a liquid crystal panel. The liquid crystal panel includes an array substrate and a cover plate that are opposite, and a liquid crystal layer between the array substrate and the cover plate. In the embodiments of the present disclosure, the array substrate in the liquid crystal panel is the array substrate in the above embodiments.

In some embodiments, the liquid crystal panel is a liquid crystal display panel. In this case, the cover plate in the liquid crystal panel is a color film substrate.

In some embodiments, the liquid crystal panel is a liquid crystal handwriting board. In this case, the liquid crystal layer in the liquid crystal panel includes bistable liquid crystal molecules, and the cover plate in the liquid crystal panel includes a flexible base substrate and a common electrode layer on a side of the flexible base substrate.

It should be noted that in the accompanying drawings, the sizes of the layers and regions may be scaled up for clarity of the illustration. It can be understood that when an element or layer is described as being "above" another element or layer, the described element or layer may be directly on the other element or layer, or an intermediate layer may exist. In addition, it can be understood that when an element or layer is described as being "below" another element or layer, the described element or layer may be directly below the other element or layer, or more than one intermediate layer or element may exist. In addition, it can also be understood that when a layer or element is described as being arranged "between" two layers or elements, the described layer or element may be the only layer between the two layers or elements, or more than one intermediate layer or element may exist. In the whole description, like reference numerals denote like elements.

In the present disclosure, the terms "first" and "second" are configured for descriptive purposes only and are not to be construed as indicating or implying relative importance. The term "a plurality of" refers to two or more, unless specifically defined otherwise.

Described above are merely exemplary embodiments of the present disclosure, and are not intended to limit the present disclosure. Any modifications, equivalent substitutions, improvements, and the like within the spirit and principles of the disclosure are included in the scope of protection of the present disclosure.

The invention claimed is:

1. An array substrate, provided with a display region and a non-display region on a periphery of the display region, the array substrate comprising:
    a base substrate;
    a pixel electrode and a thin-film transistor on a side of the base substrate, wherein the pixel electrode and the thin-film transistor are disposed in the display region, and the pixel electrode is disposed on a side, facing away from the base substrate, of the thin-film transistor;
    a first passivation layer between the pixel electrode and the thin-film transistor, wherein a plurality of first vias are defined in the first passivation layer, at least part of the plurality of first vias are disposed in the display region, and the pixel electrode is electrically connected to the thin-film transistor through the at least part of the plurality of first vias in the display region; and
    a second passivation layer on a side, facing away from the base substrate, of the pixel electrode, wherein a plurality of second vias are defined in the second passivation layer, at least part of the plurality of second vias are disposed in the display region, the at least part of the plurality of second vias in the display region are in one-to-one correspondence to the at least part of the plurality of first vias in the display region, and an overlapped region is present between an orthogonal projection of each of the at least part of the plurality of second vias in the display region on the base substrate and an orthogonal projection of the corresponding first via on the base substrate.

2. The array substrate according to claim 1, wherein a central axis of each of the plurality of first vias is coincided with a central axis of the corresponding second via.

3. The array substrate according to claim 2, wherein a ratio of a size of an opening in a side, proximal to the base substrate, of each of the plurality of first vias to a size of an opening in a side, facing away from the base substrate, of each of the plurality of first vias is equal to a ratio of a size of an opening in a side, proximal to the base substrate, of the corresponding second via to a size of an opening in a side, facing away from the base substrate, of the corresponding second via.

4. The array substrate according to claim 3, wherein an orthogonal projection of each of the plurality of second vias on the base substrate is within an orthogonal projection of the corresponding first via on the base substrate.

5. The array substrate according to claim 1, wherein one part of the plurality of first vias are disposed in the display region, the other part of the plurality of first vias are disposed in the non-display region, one part of the plurality of second vias are disposed in the display region, and the other part of the plurality of second vias are disposed in the non-display region, wherein the other part of the plurality of second vias in the non-display region are in one-to-one correspondence to the other part of the plurality of first vias in the non-display region, and an overlapped region is present between an orthogonal projection of each of the other part of the plurality of second vias in the non-display region on the base substrate and an orthogonal projection of the corresponding first via on the base substrate.

6. The array substrate according to claim 5, further comprising: a first electrode, a second electrode, and a first transparent connecting electrode that are disposed in the non-display region, wherein the first transparent connecting electrode and the pixel electrode are disposed in the same layer and made of the same material, the first transparent connecting electrode is in contact with the first electrode through one part of the plurality of first vias in the non-display region, and is in contact with the second electrode through the other part of the plurality of first vias in the non-display region.

7. The array substrate according to claim 6, wherein a width of each of the plurality of second vias in any direction parallel to the base substrate ranges from 5 microns to 12 microns.

8. The array substrate according to claim 6, further comprising: a plurality of support pillars on a side, facing away from the base substrate, of the second passivation layer, and a plurality of auxiliary isolation pillars in the same layer and made of the same material as the plurality of support pillars, wherein the plurality of auxiliary isolation pillars are in one-to-one correspondence to the plurality of second vias and in one-to-one correspondence to the plurality of first vias, and at least part of each of the plurality of auxiliary isolation pillars is disposed in the corresponding first via and the corresponding second via.

9. The array substrate according to claim 1, wherein the plurality of first vias are in one-to-one correspondence to the plurality of second vias, and an overlapped region is present between an orthogonal projection of each of the plurality of second vias on the base substrate and an orthogonal projection of the corresponding first via on the base substrate.

10. The array substrate according to claim 1, wherein a first hollow cavity in the non-display region is further defined in the first passivation layer, and a second hollow cavity in the non-display region is further defined in the second passivation layer, wherein an overlapped region is present between an orthogonal projection of the second hollow cavity on the base substrate and an orthogonal projection of the first hollow cavity on the base substrate.

11. The array substrate according to claim 10, further comprising: an auxiliary signal line in the display region, and a signal connecting electrode and a second transparent connecting electrode in the non-display region; wherein an overlapped region is present between an orthogonal projection of the auxiliary signal line on the base substrate and an orthogonal projection of the pixel electrode on the base substrate;

the signal connecting electrode and the auxiliary signal line are disposed in the same layer and made of the same material, the signal connecting electrode is electrically connected to the auxiliary signal line, and an overlapped region is present between an orthogonal projection of the signal connecting electrode on the base substrate and the orthogonal projection of the first hollow cavity on the base substrate; and the second transparent connecting electrode and the pixel electrode are disposed in the same layer and made of the same material, and the second transparent connecting electrode is in contact with the signal connecting electrode in the first hollow cavity.

12. The array substrate according to claim 11, wherein at least one first hollow cavity is defined in the first passivation layer, and an orthogonal projection of the second transparent connecting electrode on the base substrate is within the orthogonal projection of the first hollow cavity on the base substrate; and/or a plurality of first hollow cavities are defined in the first passivation layer, part of the orthogonal projection of the second transparent connecting electrode on the base substrate is within the orthogonal projection of the first hollow cavity on the base substrate, and the other part of the second transparent connecting electrode is beyond the orthogonal projection of the first hollow cavity on the base substrate.

13. The array substrate according to claim 12, wherein a side, facing away from the base substrate, of the second transparent connecting electrode is in contact with a common electrode layer in a cover plate through a conductive connecting structure, wherein at least part of the conductive connecting structure is within at least one of the second hollow cavity.

14. The array substrate according to claim 1, wherein a first connecting cavity in the non-display region is further defined in the first passivation layer, and a second connecting cavity in the non-display region is further defined in the second passivation layer, wherein an overlapped region is present between an orthogonal projection of the second connecting cavity on the base substrate and an orthogonal projection of the first connecting cavity on the base substrate.

15. The array substrate according to claim 14, further comprising: a plurality of signal lines in the display region, and a plurality of pads and a plurality of third transparent connecting electrodes in the non-display region; wherein the plurality of signal lines are electrically connected to the plurality of pads in one-to-one correspondence, and an overlapped region is present between an orthogonal projection of each of the plurality of pads on the base substrate and the orthogonal projection of the first connecting cavity on the base substrate; and the plurality of third transparent connecting electrodes and the pixel electrode are disposed in the same layer and made of the same material, the plurality of third transparent connecting electrodes are in one-to-one correspondence to the plurality of pads, and each of the plurality of third transparent connecting electrodes is in contact with the corresponding pad in the first connecting cavity.

16. The array substrate according to claim 15, wherein one of the first connecting cavity is defined in the first passivation layer, orthogonal projection of the plurality of pads on the base substrate are within the orthogonal projection of the first connecting cavity on the base substrate; or a plurality of first connecting cavities are defined in the first passivation layer, the plurality of first connecting cavities are in strip shape and are in one-to-one correspondence to the plurality of pads, and an orthogonal projection of each of the plurality of pads on the base substrate is at least partially within an orthogonal projection of the corresponding first connecting cavity on the base substrate.

17. A method for manufacturing an array substrate, comprising:
sequentially forming a thin-film transistor, a first passivation layer, a pixel electrode, and a second passivation layer on a side of the base substrate; wherein
the array substrate is provided with a display region and a non-display region on a periphery of the display region, the pixel electrode and the thin-film transistor are disposed in the display region, and the pixel electrode is disposed on a side, facing away from the base substrate, of the thin-film transistor;
the first passivation layer is disposed between the pixel electrode and the thin-film transistor, a plurality of first vias are defined in the first passivation layer, at least part of the plurality of first vias are disposed in the display region, and the pixel electrode is electrically connected to the thin-film transistor through the at least part of the plurality of first vias in the display region; and
the second passivation layer is disposed on a side, facing away from the base substrate, of the pixel electrode, a plurality of second vias are defined in the second passivation layer, at least part of the plurality of second vias are disposed in the display region, the at least part of the plurality of second vias in the display region are in one-to-one correspondence to the at least part of the plurality of first vias in the display region, and an overlapped region is present between an orthogonal projection of each of the at least part of the plurality of second vias in the display region on the base substrate and an orthogonal projection of the corresponding first via on the base substrate.

18. The method according to claim 17, wherein the first passivation layer is acquired by patterning an insulative thin film on the side, facing away from the base substrate, of the thin-film transistor using a target mask plate, and the second passivation layer is acquired by patterning an insulative thin film on the side, facing away from the base substrate, of the pixel electrode using the target mask plate.

19. A liquid crystal panel, comprising: an array substrate and a cover plate that are opposite, and a liquid crystal layer between the array substrate and the cover plate, wherein the array substrate is provided with a display region and a non-display region on a periphery of the display region, and comprises:
a base substrate;
a pixel electrode and a thin-film transistor on a side of the base substrate, wherein the pixel electrode and the thin-film transistor are disposed in the display region, and the pixel electrode is disposed on a side, facing away from the base substrate, of the thin-film transistor;
a first passivation layer between the pixel electrode and the thin-film transistor, wherein a plurality of first vias are defined in the first passivation layer, at least part of the plurality of first vias are disposed in the display region, and the pixel electrode is electrically connected to the thin-film transistor through the at least part of the plurality of first vias in the display region; and
a second passivation layer on a side, facing away from the base substrate, of the pixel electrode, wherein a plurality of second vias are defined in the second passivation layer, at least part of the plurality of second vias are disposed in the display region, the at least part of the plurality of second vias in the display region are in one-to-one correspondence to the at least part of the plurality of first vias in the display region, and an overlapped region is present between an orthogonal projection of each of the at least part of the plurality of second vias in the display region on the base substrate and an orthogonal projection of the corresponding first via on the base substrate.

20. The liquid crystal panel according to claim 19, wherein the liquid crystal panel is a liquid crystal handwriting board, the liquid crystal layer comprises bistable liquid crystal molecules, and the cover plate comprises a flexible base substrate and a common electrode layer on a side of the flexible base substrate.

* * * * *